United States Patent
Batra et al.

(10) Patent No.: US 10,684,776 B2
(45) Date of Patent: Jun. 16, 2020

(54) MEMORY CONFIGURATION FOR INTER-PROCESSOR COMMUNICATION IN AN MPSOC

(71) Applicant: CANON KABUSHIKI KAISHA, Tokyo (JP)

(72) Inventors: Kapil Batra, Westmead (AU); Yusuke Yachide, St Leonards (AU); Haris Javaid, Kensington (AU); Sridevan Parameswaran, Kensington (AU); Su Myat Min Shwe, Alexandria (AU)

(73) Assignee: CANON KABUSHIKI KAISHA, Tokyo (JP)

( * ) Notice: Subject to any disclaimer, the term of this patent is extended or adjusted under 35 U.S.C. 154(b) by 734 days.

(21) Appl. No.: 14/735,872

(22) Filed: Jun. 10, 2015

(65) Prior Publication Data
US 2015/0363110 A1    Dec. 17, 2015

(30) Foreign Application Priority Data

Jun. 13, 2014 (AU) ................................ 2014203218

(51) Int. Cl.
*G06F 3/06* (2006.01)
*G06F 30/30* (2020.01)

(52) U.S. Cl.
CPC .......... *G06F 3/0604* (2013.01); *G06F 3/0632* (2013.01); *G06F 3/0683* (2013.01); *G06F 30/30* (2020.01)

(58) Field of Classification Search
CPC .... G06F 3/0604; G06F 3/0632; G06F 3/0683; G06F 17/5045
See application file for complete search history.

(56) References Cited

U.S. PATENT DOCUMENTS 8,230,395 B1 *  7/2012  Koh ..................... G06F 9/44557
                                                        717/121
2009/0198958 A1 *  8/2009  Arimilli .................. H04L 45/06
                                                        712/29

(Continued)

FOREIGN PATENT DOCUMENTS

EP           13250099.2     *  8/2013

OTHER PUBLICATIONS

Lukasiewycz, M., Streubuhr, M., Glass, M., Haubelt, C., Teich, J.. "Combined System Synthesis and Communication Architecture Exploration for MPSoCs". Proceedings of Design, Automation and Test in Europe (Date 2009), Proceedings from Design, Automation and Test in Europe, Nice, France, Apr. 2009; IEEE: 2009; p. 472-477.

(Continued)

*Primary Examiner* — Tim T Vo
*Assistant Examiner* — Harry Z Wang
(74) *Attorney, Agent, or Firm* — Canon U.S.A., Inc. IP Division

(57) ABSTRACT

A method determines a configuration for inter-processor communication for a heterogeneous multi-processor system. The method determines at least one subgraph of a graph representing communication between processors of the heterogeneous multi-processor system. For each subgraph the method (i) determines a plurality of subgraph design points. Each subgraph design point has a variation of channel mapping between any two of the processors in the subgraph by selecting from first-in-first-out (FIFO) memory and shared cache, and varying the shared cache and a local memory associated with at least one of the processors according to the channel mapping; and (ii) selects a memory solution for the subgraph, based on a cost associated with the selected memory solution. The method then determines a (Continued)

configuration for the graph of the heterogeneous multi-processor system, based on the selected memory solutions, to determine the configuration for inter-processor communication for the heterogeneous multi-processor system.

20 Claims, 19 Drawing Sheets

(56) References Cited

U.S. PATENT DOCUMENTS

| | | | |
|---|---|---|---|
| 2011/0019669 A1* | 1/2011 | Ma | H04L 45/00 370/389 |
| 2011/0307663 A1* | 12/2011 | Kultursay | G06F 17/5045 711/125 |
| 2013/0061020 A1* | 3/2013 | Koob | G06F 13/28 711/202 |
| 2016/0092362 A1* | 3/2016 | Barron | G06F 12/0835 710/308 |
| 2016/0218963 A1* | 7/2016 | Nauck | H04L 45/70 |

OTHER PUBLICATIONS

Jovanovic, O., Bacivarov, I., Thiele, L.. "MAMOT: Memory-Aware Mapping Optimization Tool for MPSoC". Proceedings of 2012 15th Euromicro Conference on Digital System Design (DSD), Proceedings from Digital System Design (DSD), 2012 15th Euromicro Conference on, Turkey, Sep. 2012; IEEE: 2012; p. 743-750.

* cited by examiner

| Index | Sender Processor | Receiver Processor | Data Size | Local Memory | Communication Budget |
|---|---|---|---|---|---|
| 0 | P0 | P1 | 4 KB | 4 KB | 4000 |
| 1 | P0 | P2 | 4 KB | 8 KB | 3000 |
| 2 | P0 | P3 | 4 KB | 4 KB | 2000 |
| 3 | P0 | P4 | 4 KB | 8 KB | 1000 |

Fig. 6

| Index | Sender Processor | Receiver Processor | Local Memory | FIFO | Shared Cache |
|---|---|---|---|---|---|
| 0 | P0 | P1 | 0 | - | Yes |
| 1 | P0 | P2 | 0 | - | Yes |
| 2 | P0 | P3 | 0 | - | Yes |
| 3 | P0 | P4 | 8 KB | 4 KB | No |
| 0 | P2 | P5 | 0 | - | Yes |
| 1 | P2 | P6 | 0 | - | Yes |

Shared Cache parameters - Size:32 KB, Line Size:4 Words, Associativity:4

Fig. 11

| Sub-graph | Possible Memory Solution |
|---|---|
|  |  |
|  |  |
|  |  |
|  |  |
|  |  |
|  |  |
|  |  |
|  |  |

MEMORY CONFIGURATION FOR INTER-PROCESSOR COMMUNICATION IN AN MPSOC

REFERENCE TO RELATED PATENT APPLICATION(S)

This application claims the benefit under 35 U.S.C. §119 of the filing date of Australian Patent Application No. 2014203218, filed Jun. 13, 2014, hereby incorporated by reference in its entirety as if fully set forth herein.

TECHNICAL FIELD

The present invention relates to automation tools for designing digital hardware systems in the electronics industry and, in particular, to the memory configuration for inter-processor communication in multiprocessor system-on-chip (MPSoC).

BACKGROUND

The continuous increase in transistor density on a single die has enabled integration of more and more components in a system-on-chip (SoC), such as multiple processors, memories, etc. Although the integration of more and more components has significantly improved the intrinsic computational power of SoCs, such integration has also significantly increased the design complexity. Continuously increasing design complexity is exacerbating the well-known issue of design productivity gap. To meet time-to-design and time-to-market deadlines, industry is gradually shifting towards the use of automation tools at a higher level of design abstraction.

Heterogeneous multiprocessor system-on-chip (MPSoC) devices integrate multiple different processors to handle the high performance requirements of applications. An MPSoC primarily consists of multiple computational elements, examples of which include general-purpose processors, application-specific processors, and custom hardware accelerators, and communication channels. Hereafter in this document, such computational elements are collectively referred to as processors. A communication channel connects two processors, where a first processor, in this instance operating as a "sender-processor", sends data and a second processor, in this instance operating as a "receiver-processor", receives the data. Communication channels in an MPSoC can be implemented using first-in-first-out (FIFO) memory, shared memory, shared cache etc. Processors can also have private on-chip local memory (LM) used as a scratchpad memory for temporary storage of data. The mapping of communication channels can influence the size of LM associated with a receiver-processor. Memory configuration, including FIFOs, shared memory, shared cache and LMs, used for data communication contributes significantly to the overall area and performance of an MPSoC. A complex MPSoC can have a large number of communication channels between processors. The design space for memory configuration for inter-processor communication is defined as all the possible combinations of the implementation of communication channels along with the variations of LMs connected to the processors. One combination of the implementation of communication channels, along with a selected size of LMs for all the processors, represents one design point.

Mapping a complex streaming application on to an MPSoC to achieve performance requirements can be a very time intensive task. There has been an increased focus on automating the implementation of streaming multimedia applications on MPSoC platforms.

In one known method, an area of a pipelined MPSoC is optimized under latency or throughput constraint using an integer linear programming (ILP) approach for a multimedia application. The optimization method assumes that data communication between processors is achieved by using queues implementing FIFO protocol. The size of the queues is sufficiently large to hold an iteration of a data block, which can vary depending on the application. For example, a data block may include a group of pixels of an input image stream needed by any processor to independently execute the task mapped on the processor. The size of queues can significantly increase the area of an MPSoC for applications having a large data block size, which as a result, increases the cost of the MPSoC.

In another method, a design space exploration approach using linear constraints and a pseudo Boolean solver is proposed for optimization of the topology and communication routing of a system. Communication channels are commonly restricted to be mapped to memory resources. This approach does not consider multiple levels of memory hierarchies involving shared caches. Shared caches are on-chip memories which contain a subset of the contents of the external off-chip memory and provide better performance in comparison to the use of external off-chip memories alone. Not including shared caches may result in a significant increase in the on-chip memory area for a range of applications.

In another method, memory aware mapping of applications onto MPSoCs is proposed using evolutionary algorithms. Memory resources include private memories and shared memories. The limitation of this approach is that the method maps the application on a fixed memory platform, which is provided as an input to the method. In addition, the memory platform does not include shared caches. Including shared caches in the design space provides the flexibility to map communication data to off-chip memories and reduce on-chip memory area.

In another method, memory mapping is automatically determined and generated to provide an optimization of execution of the program on the target device. The memory mapping includes a description of the placement of the uniquely named memory sections to portions of the one or more memory elements of the target device. One limitation of this approach is that that the approach optimizes the memory mapping for a fixed memory platform, which is provided as an input to the method.

The memory configuration for inter-processor communication ("MC-IPrC") can have a significant impact on the area and performance of an MPSoC. There is a need for design automation methods to consider MC-IPrC including FIFOs, shared caches and local memories when mapping streaming applications onto MPSoCs.

SUMMARY

The present disclosure focuses on how to efficiently and effectively sample the design space in order to determine MC-IPrC in an MPSoC to satisfy performance requirement of the application. Disclosed are arrangements to determine memory configuration for inter-processor communication (MC-IPrC) for a heterogeneous multiprocessor system-on-chip (MPSoC). According to this disclosure, the design space is efficiently sampled to determine a MC-IPrC for an MPSoC to satisfy the constraints provided by the designer.

MC-IPrC includes FIFOs connecting processors, shared caches and local memories of the processors. The disclosed arrangements focus on determining a MC-IPrC based on the subgraph memory solutions, which are determined by exploring subgraph design space in isolation. Earlier methods either do not consider shared caches in the memory hierarchies or map the application on a fixed memory platform, which limits their use.

According to one aspect of the present disclosure there is provided method of determining a configuration for inter-processor communication for a heterogeneous multi-processor system, the method comprising:

determining at least one subgraph of a graph representing communication between processors of the heterogeneous multi-processor system;

for each said subgraph:

determining a plurality of subgraph design points for said subgraph, each of the subgraph design points having a variation of at least one of first-in-first-out (FIFO) memory between any two of the processors of the subgraph, cache shared between any at least two of the processors of the subgraph, and local memory associated with any one of the processors of the subgraph; and selecting a memory solution for said subgraph, from the plurality of determined subgraph design points, based on a cost associated with the selected memory solution; and determining a configuration for the graph of the heterogeneous multi-processor system, based on the selected memory solutions, to determine the configuration for inter-processor communication for the heterogeneous multi-processor system.

In one embodiment, the determining of the configuration for the graph comprises combining recursively combining subgraphs subject to a combination cost.

In one embodiment the determining the configuration of the graph comprises combining the memory solutions for each of the subgraphs in a pool in a single step.

Typically the subgraphs are created based on common data transferred between processors.

In one embodiment the subgraphs are created based communication channels associated with one of a sender-processor or a receiver-processor.

In a specific implementation, the cost associated with the selected memory solution comprises a combination cost associated with the area of on-chip memory consumed for a combination of particular subgraphs. In one embodiment, the combination cost is associated with an area saving for on-chip memory associated with a performance constraint.

Beneficially the cost associated with the selected memory solution is associated with energy savings under a performance constraint.

According to another aspect of the present disclosure there is provided a method of determining a configuration for inter-processor communication for a heterogeneous multi-processor system, the method comprising:

determining at least one subgraph of a graph representing communication between processors of the heterogeneous multi-processor system, the subgraph being determined based on common data;

for each said subgraph:

determining a plurality of subgraph design points for said subgraph, each of the subgraph design points having a variation of channel mapping between any two of the processors in the subgraph by selecting from first-in-first-out (FIFO) memory and shared cache, and varying the shared cache and a local memory associated with at least one of the processors according to the channel mapping; and selecting a memory solution for said subgraph, from the plurality of determined subgraph design points, based on a cost associated with the selected memory solution; and determining a configuration for the graph of the heterogeneous multi-processor system, based on the selected memory solutions, to determine the configuration for inter-processor communication for the heterogeneous multi-processor system.

According to another aspect, disclosed is a heterogeneous multi-processor system having an inter-processor communication configuration formed according to the methods described herein.

Other aspects are also disclosed.

BRIEF DESCRIPTION OF THE DRAWINGS

At least one embodiment of the present invention will now be described with reference to the following drawings, in which:

FIG. 6 is an example of a subgraph table for the subgraph 400 shown in FIG. 4A;

FIG. 11 is an example of a memory solution determined by combining the memory solutions shown in FIG. 7 and FIG. 10;

DETAILED DESCRIPTION

Context

The mapping of streaming applications on MPSoCs involves parallelisation of application software, mapping of software on to multiple processors, and the mapping of communication channels between processors on appropriate resources. Data communication between processors is generally restricted to be mapped on to MPSoC memory subsystems including queues connecting processors, shared memories, shared caches and local memories. A complex MPSoC can have a large number of communication channels resulting in a huge design space for memory configurations for inter-processor communication (MC-IPrC). Hence, it takes a long time to select a MC-IPrC for an MPSoC to satisfy requirements of a designer that include area, performance etc. The disclosed arrangements address this issue to effectively select the MC-IPrC by efficiently and effectively sampling the design space.

Overview

Proposed is a method to determine the memory configuration for inter-processor communication (MC-IPrC) in an MPSoC. MC-IPrC specifies multi-level memory hierarchy including local memories (LM), first-in-first-out (FIFO) memories and shared caches. LM is a private memory connected to the processor. FIFOs connect two processors, where a sender-processor produces data and a receiver-processor consumes the data. Shared caches are accessible by a plurality of processors enabling communication between them. Shared caches are on-chip memories which contain a subset of the contents of the external off-chip memory and provide better performance in comparison to external off-chip memories.

Due to the large design space, it is not feasible to determine a MC-IPrC which satisfies constraints of a designer by performing an exhaustive search. The presently disclosed method efficiently and effectively samples the design space to determine MC-IPrC for an MPSoC. The described method operates by dividing the MC-IPrC design space into multiple sub-divided design spaces, which are explored in isolation. The memory configuration for inter-processor communication, MC-IPrC, for an MPSoC is determined based on the results obtained by exploring sub-divided design spaces.

Figure 12A:
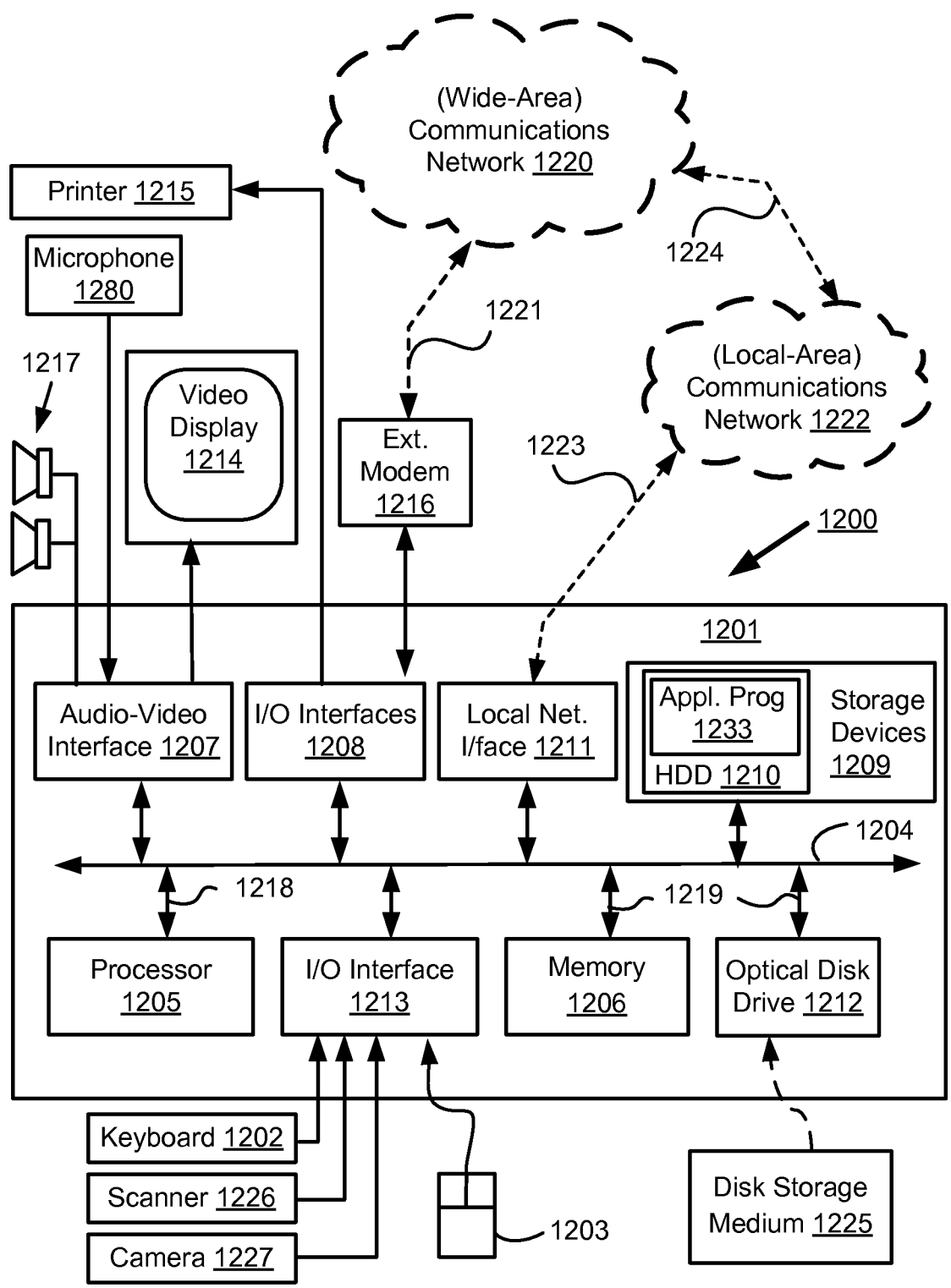
FIGS. 12A and 12B form a schematic block diagram of a general purpose computer system on which the presently disclosed methods to determine MC-IPrC may be practised.
Figure 12B:
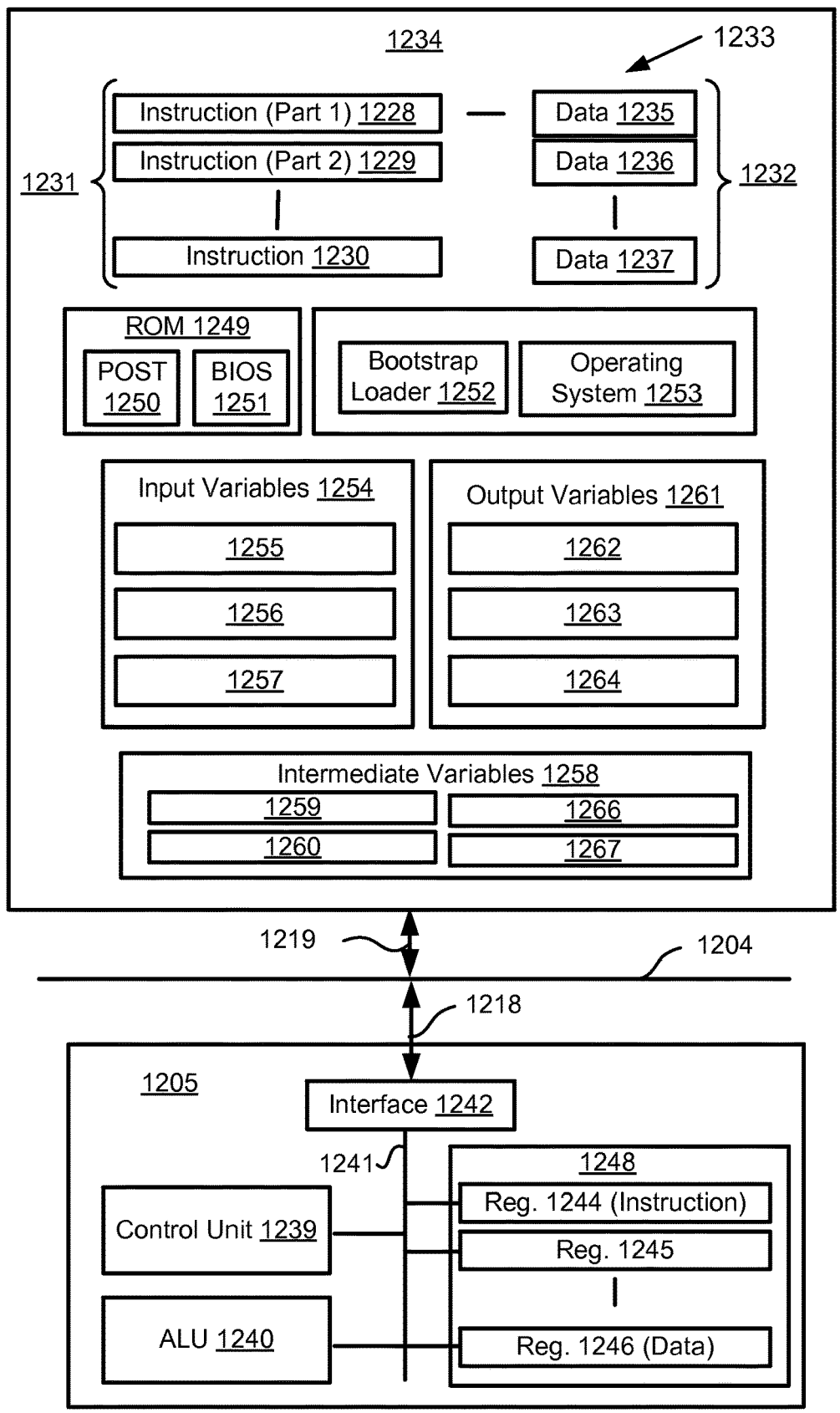

FIGS. 12A and 12B depict a general-purpose computer system 1200, upon which the various arrangements described can be practiced.

As seen in FIG. 12A, the computer system 1200 includes: a computer module 1201; input devices such as a keyboard 1202, a mouse pointer device 1203, a scanner 1226, a camera 1227, and a microphone 1280; and output devices including a printer 1215, a display device 1214 and loudspeakers 1217. An external Modulator-Demodulator (Modem) transceiver device 1216 may be used by the computer module 1201 for communicating to and from a communications network 1220 via a connection 1221. The communications network 1220 may be a wide-area network (WAN), such as the Internet, a cellular telecommunications network, or a private WAN. Where the connection 1221 is a telephone line, the modem 1216 may be a traditional "dial-up" modem. Alternatively, where the connection 1221 is a high capacity (e.g., cable) connection, the modem 1216 may be a broadband modem. A wireless modem may also be used for wireless connection to the communications network 1220.

The computer module 1201 typically includes at least one processor unit 1205, and a memory unit 1206. For example, the memory unit 1206 may have semiconductor random access memory (RAM) and semiconductor read only memory (ROM). The computer module 1201 also includes an number of input/output (I/O) interfaces including: an audio-video interface 1207 that couples to the video display 1214, loudspeakers 1217 and microphone 1280; an I/O interface 1213 that couples to the keyboard 1202, mouse 1203, scanner 1226, camera 1227 and optionally a joystick or other human interface device (not illustrated); and an interface 1208 for the external modem 1216 and printer 1215. In some implementations, the modem 1216 may be incorporated within the computer module 1201, for example within the interface 1208. The computer module 1201 also has a local network interface 1211, which permits coupling of the computer system 1200 via a connection 1223 to a local-area communications network 1222, known as a Local Area Network (LAN). As illustrated in FIG. 12A, the local communications network 1222 may also couple to the wide network 1220 via a connection 1224, which would typically include a so-called "firewall" device or device of similar functionality. The local network interface 1211 may comprise an Ethernet circuit card, a Bluetooth™ wireless arrangement or an IEEE 802.11 wireless arrangement; however, numerous other types of interfaces may be practiced for the interface 1211.

The I/O interfaces 1208 and 1213 may afford either or both of serial and parallel connectivity, the former typically being implemented according to the Universal Serial Bus (USB) standards and having corresponding USB connectors (not illustrated). Storage devices 1209 are provided and typically include a hard disk drive (HDD) 1210. Other storage devices such as a floppy disk drive and a magnetic tape drive (not illustrated) may also be used. An optical disk drive 1212 is typically provided to act as a non-volatile source of data. Portable memory devices, such optical disks (e.g., CD-ROM, DVD, Blu-ray Disc™), USB-RAM, portable, external hard drives, and floppy disks, for example, may be used as appropriate sources of data to the system 1200.

The components 1205 to 1213 of the computer module 1201 typically communicate via an interconnected bus 1204 and in a manner that results in a conventional mode of operation of the computer system 1200 known to those in the relevant art. For example, the processor 1205 is coupled to the system bus 1204 using a connection 1218. Likewise, the memory 1206 and optical disk drive 1212 are coupled to the system bus 1204 by connections 1219. Examples of computers on which the described arrangements can be practised include IBM-PC's and compatibles, Sun Sparcstations, Apple Mac™ or a like computer systems.

The methods of determining a configuration for inter-processor communication for a heterogeneous multi-processor system may be implemented using the computer system 1200 wherein the processes of FIGS. 1-11, 13 and 14 to be described, may be implemented as one or more software application programs 1233 executable within the computer system 1200. In particular, the steps of the communication determining methods are effected by instructions 1231 (see FIG. 12B) in the software 1233 that are carried out within the computer system 1200. The software instructions 1231 may be formed as one or more code modules, each for performing one or more particular tasks. The software may also be divided into two separate parts, in which a first part and the corresponding code modules performs the determining methods and a second part and the corresponding code modules manage a user interface between the first part and the user.

The software may be stored in a computer readable medium, including the storage devices described below, for example. The software is loaded into the computer system 1200 from the computer readable medium, and then executed by the computer system 1200. A computer readable medium having such software or computer program recorded on the computer readable medium is a computer program product. The use of the computer program product in the computer system 1200 may effect an apparatus for determining a configuration for inter-processor communication for a heterogeneous multi-processor system.

The software 1233 is typically stored in the HDD 1210 or the memory 1206. The software is loaded into the computer system 1200 from a computer readable medium, and executed by the computer system 1200. Thus, for example, the software 1233 may be stored on an optically readable disk storage medium (e.g., CD-ROM) 1225 that is read by the optical disk drive 1212. A computer readable medium having such software or computer program recorded on it is a computer program product. The use of the computer program product in the computer system 1200 may effect an apparatus for determining a configuration for inter-processor communication for a heterogeneous multi-processor system.

In some instances, the application programs 1233 may be supplied to the user encoded on one or more CD-ROMs 1225 and read via the corresponding drive 1212, or alternatively may be read by the user from the networks 1220 or 1222. Still further, the software can also be loaded into the computer system 1200 from other computer readable media. Computer readable storage media refers to any non-transitory tangible storage medium that provides recorded instructions and/or data to the computer system 1200 for execution and/or processing. Examples of such storage media include floppy disks, magnetic tape, CD-ROM, DVD, Blu-ray Disc™, a hard disk drive, a ROM or integrated circuit, USB memory, a magneto-optical disk, or a computer readable card such as a PCMCIA card and the like, whether or not such devices are internal or external of the computer module 1201. Examples of transitory or non-tangible computer readable transmission media that may also participate in the provision of software, application programs, instructions and/or data to the computer module 1201 include radio or infra-red transmission channels as well as a network connection to another computer or networked device, and the Internet or Intranets including e-mail transmissions and information recorded on Websites and the like.

The second part of the application programs 1233 and the corresponding code modules mentioned above may be executed to implement one or more graphical user interfaces (GUIs) to be rendered or otherwise represented upon the display 1214. Through manipulation of typically the keyboard 1202 and the mouse 1203, a user of the computer system 1200 and the application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 1217 and user voice commands input via the microphone 1280.

FIG. 12B is a detailed schematic block diagram of the processor 1205 and a "memory" 1234. The memory 1234 represents a logical aggregation of all the memory modules (including the HDD 1209 and semiconductor memory 1206) that can be accessed by the computer module 1201 in FIG. 12A.

When the computer module 1201 is initially powered up, a power-on self-test (POST) program 1250 executes. The POST program 1250 is typically stored in a ROM 1249 of the semiconductor memory 1206 of FIG. 12A. A hardware device such as the ROM 1249 storing software is sometimes referred to as firmware. The POST program 1250 examines hardware within the computer module 1201 to ensure proper functioning and typically checks the processor 1205, the memory 1234 (1209, 1206), and a basic input-output systems software (BIOS) module 1251, also typically stored in the ROM 1249, for correct operation. Once the POST program 1250 has run successfully, the BIOS 1251 activates the hard disk drive 1210 of FIG. 12A. Activation of the hard disk drive 1210 causes a bootstrap loader program 1252 that is resident on the hard disk drive 1210 to execute via the processor 1205. This loads an operating system 1253 into the RAM memory 1206, upon which the operating system 1253 commences operation. The operating system 1253 is a system level application, executable by the processor 1205, to fulfil various high level functions, including processor management, memory management, device management, storage management, software application interface, and generic user interface.

The operating system 1253 manages the memory 1234 (1209, 1206) to ensure that each process or application running on the computer module 1201 has sufficient memory in which to execute without colliding with memory allocated to another process. Furthermore, the different types of memory available in the system 1200 of FIG. 12A must be used properly so that each process can run effectively. Accordingly, the aggregated memory 1234 is not intended to illustrate how particular segments of memory are allocated (unless otherwise stated), but rather to provide a general view of the memory accessible by the computer system 1200 and how such is used.

As shown in FIG. 12B, the processor 1205 includes a number of functional modules including a control unit 1239, an arithmetic logic unit (ALU) 1240, and a local or internal memory 1248, sometimes called a cache memory. The cache memory 1248 typically includes a number of storage registers 1244-1246 in a register section. One or more internal busses 1241 functionally interconnect these functional modules. The processor 1205 typically also has one or more interfaces 1242 for communicating with external devices via the system bus 1204, using a connection 1218. The memory 1234 is coupled to the bus 1204 using a connection 1219.

The application program 1233 includes a sequence of instructions 1231 that may include conditional branch and loop instructions. The program 1233 may also include data 1232 which is used in execution of the program 1233. The instructions 1231 and the data 1232 are stored in memory locations 1228, 1229, 1230 and 1235, 1236, 1237, respectively. Depending upon the relative size of the instructions 1231 and the memory locations 1228-1230, a particular instruction may be stored in a single memory location as depicted by the instruction shown in the memory location 1230. Alternately, an instruction may be segmented into a number of parts each of which is stored in a separate memory location, as depicted by the instruction segments shown in the memory locations 1228 and 1229.

In general, the processor 1205 is given a set of instructions which are executed therein. The processor 1205 waits for a subsequent input, to which the processor 1205 reacts to by executing another set of instructions. Each input may be provided from one or more of a number of sources, including data generated by one or more of the input devices 1202, 1203, data received from an external source across one of the networks 1220, 1222, data retrieved from one of the storage devices 1206, 1209 or data retrieved from a storage medium 1225 inserted into the corresponding reader 1212, all depicted in FIG. 12A. The execution of a set of the instructions may in some cases result in output of data. Execution may also involve storing data or variables to the memory 1234.

The disclosed communications determining arrangements use input variables 1254, which are stored in the memory 1234 in corresponding memory locations 1255, 1256, 1257. The arrangements produce output variables 1261, which are stored in the memory 1234 in corresponding memory locations 1262, 1263, 1264. Intermediate variables 1258 may be stored in memory locations 1259, 1260, 1266 and 1267.

Referring to the processor 1205 of FIG. 12B, the registers 1244, 1245, 1246, the arithmetic logic unit (ALU) 1240, and the control unit 1239 work together to perform sequences of micro-operations needed to perform "fetch, decode, and execute" cycles for every instruction in the instruction set making up the program 1233. Each fetch, decode, and execute cycle comprises:

(i) a fetch operation, which fetches or reads an instruction 1231 from a memory location 1228, 1229, 1230;

(ii) a decode operation in which the control unit 1239 determines which instruction has been fetched; and (iii) an execute operation in which the control unit 1239 and/or the ALU 1240 execute the instruction.

Thereafter, a further fetch, decode, and execute cycle for the next instruction may be executed. Similarly, a store cycle may be performed by which the control unit 1239 stores or writes a value to a memory location 1232.

Each step or sub-process in the processes of FIGS. 1 to 11, 13 and 14 is associated with one or more segments of the program 1233 and is performed by the register section 1244, 1245, 1246, the ALU 1240, and the control unit 1239 in the processor 1205 working together to perform the fetch, decode, and execute cycles for every instruction in the instruction set for the noted segments of the program 1233.

First Implementation

Figure 1A:
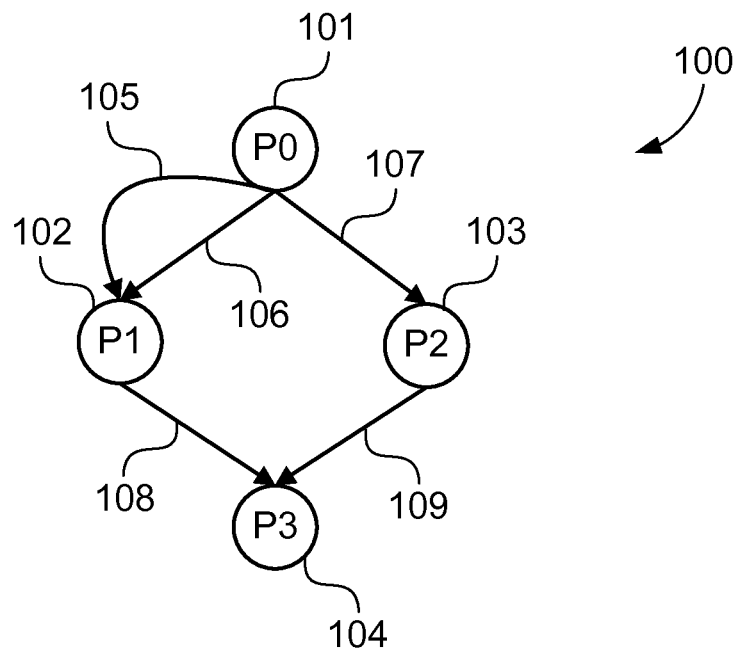
FIG. 1A is an example of a graph representing a heterogeneous MPSoC.

FIG. 1A shows an example of a graph 100 that represents a heterogeneous MPSoC. The graph 100 depicts the processors and the communication channels between processors, which are part of the MPSoC. The graph 100 shows four processors 101-104 and five communication channels 105-109 of the MPSoC. The communication channels 105-109 indicate the flow of data between the connected processors 101 to 104. The communications channels 105-109 also indicate the direction of data flow, for example from processor 101 to processor 102 via the channel 106. Since the channel 106 and adjacent channel 105 are unidirectional and point in the same direction, such indicates in this example, that the processor 102 is unable to communicate data to the processor 101. As such, the graph 100 represents a pipelined MPSoC. Where bi-directional communications between two processors is necessary, such is represented in a graph by two independent unidirectional communication channels.

Figure 1B:
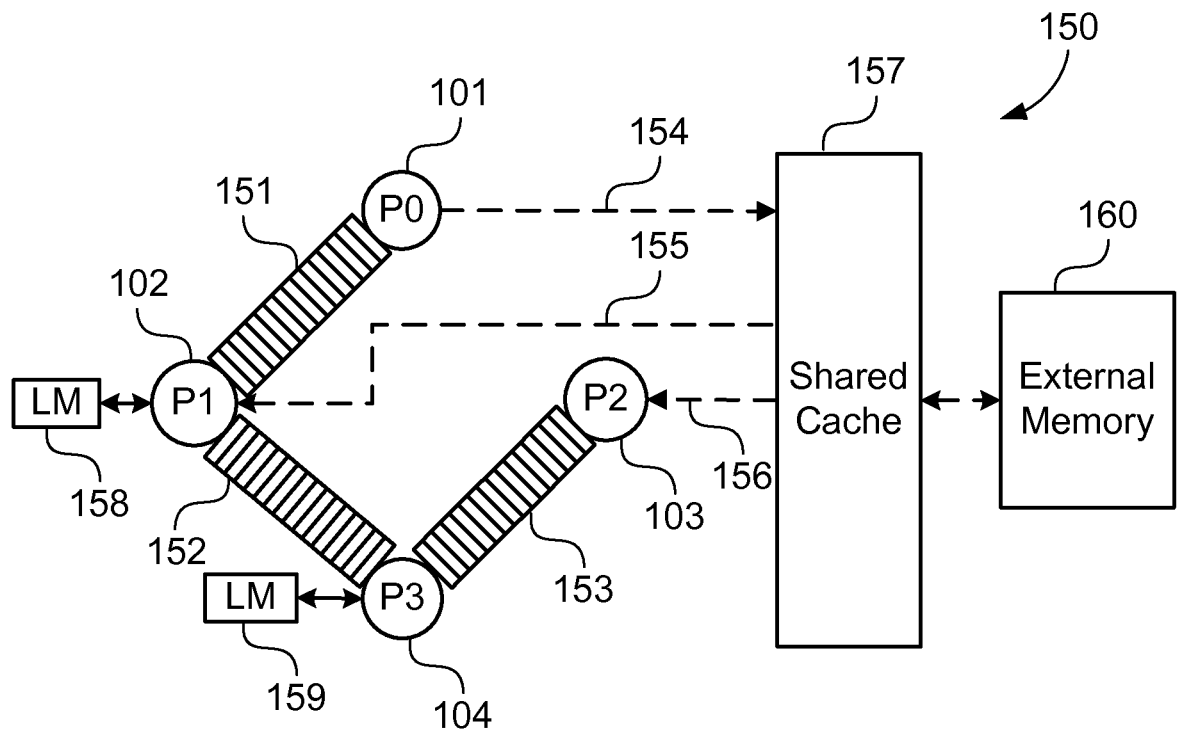
FIG. 1B is an example of a MC-IPrC for a graph representing MPSoC shown in FIG. 1A.

FIG. 1B shows an example of a heterogeneous MPSoC 150 depicting components of the MC-IPrC for the graph 100. FIFOs 151-153 provide direct data connections between the processors 101 to 104. For example, FIFO 151 provides a direct connection between a sender-processor 101 and a receiver-processor 102. Interfaces 154-156 are provided between the processors 101 to 103 to a shared cache 157. The shared cache interfaces 154-156 enable communication from the processor 101 to the processors 102 and 103 via the shared cache 157. Shared cache 157 contains a subset of the contents of an external memory 160, which is an off-chip memory. Local memories (LM) 158 and 159 connect to the processors 102 and 104 respectively. For example, the LM 158 is connected to the processor 102 and is only accessible by the processor 102. According to the present description, a connection to a local memory (LM) is not a communication channel.

Each communication channel of an MPSoC may be implemented as either a FIFO or by mapping to a shared cache. The design space of the MPSoC is primarily dependent on the number of communication channels and the number of shared cache configurations. Due to the design space having a large size, it is not feasible to do an exhaustive search for an optimal solution, and a manual approach may not provide satisfactory results. The disclosed method determines the MC-IPrC comprising sizes of the local memories, appropriate implementation of communication channels and shared cache parameters for an input application. Shared cache parameters include cache size, associativity and line size.

Figure 2:
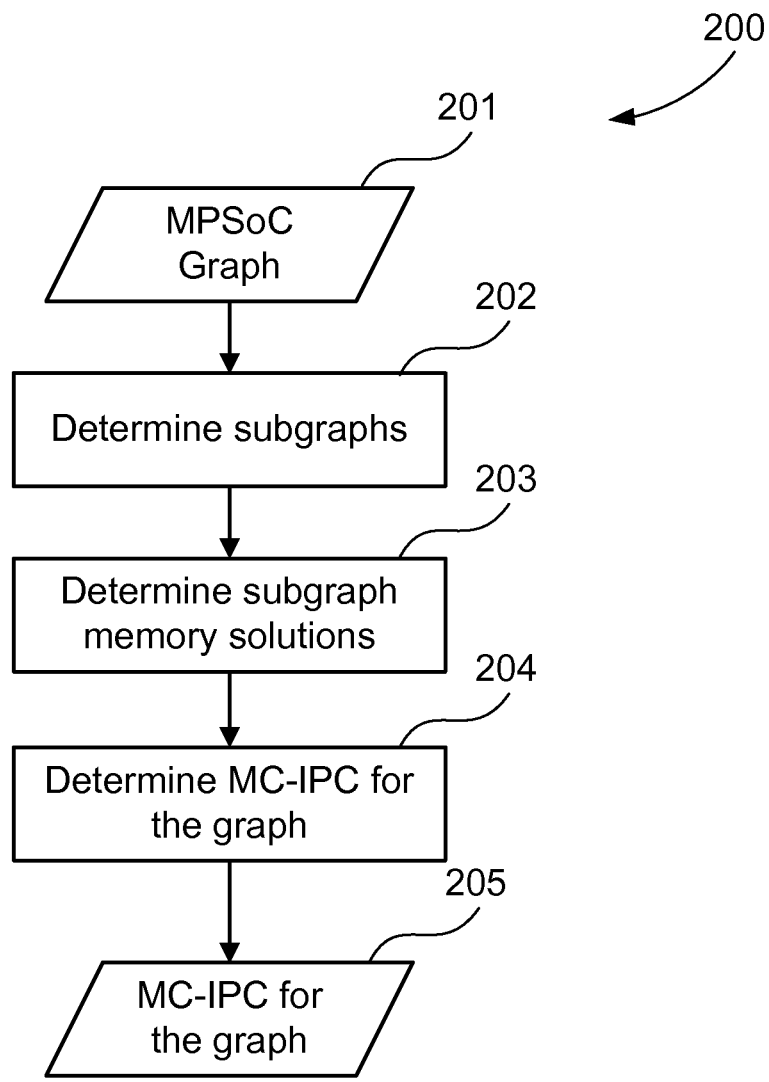
FIG. 2 is a dataflow diagram illustrating a method to determine a MC-IPrC for a graph representing a heterogeneous MPSoC.

An implementation determines MC-IPrC to reduce the on-chip memory area while satisfying performance constraint provided by the designer. FIG. 2 illustrates an overview of a method 200 of the implementation. The method 200 may be implemented as one of the application programs 1233 stored in the HDD 1210 and executable by the CPU 1205. The method 200 receives the graph 201 representing a heterogeneous MPSoC as input. The graph 201 may be stored in the HDD 1210 as part of a design of the MPSoC or alternatively for example received from an external source, such as a server computer, via a communications network (not illustrated) coupled to the computer system 1200 via the interface 1209. Step 202 determines a plurality of subgraphs from the graph 201. Step 203 determines a memory solution for each of the subgraphs by exploring the design space of the subgraphs in isolation. Design space of the subgraph is defined as the variations of the FIFOs, LMs and shared caches only for the channel parts of the subgraph. A cache variation along with its associated set of LMs and FIFOs may be defined as a subgraph design point of the particular subgraph. A plurality of design points are determined and a memory solution is determined by selecting one design point. Step 204 then analyses the memory solutions of the subgraphs to heuristically determine a MC-IPrC 205 for the graph 201 representing MPSoC.

Each of the steps of the method 200 are further described in detail below. Step 202, to determine subgraphs, is described using an example shown in FIG. 3. As an example, graph 300 represents a heterogeneous MPSoC with eight processors 301-308. In an implementation, subgraphs are determined by grouping the communication channels which carry the same data. A subgraph includes at least one sender-processor which produces data, and at least one receiver-processor which consumes the data. For example, sender-processor 301 transfers the same data over the communication channels 309-312 to the receiver-processors 302-305, and sends different data over the channel 313 to the receiver-processor 302. Replication and transmission of same data by a sender-processor is often desired to increase parallelisation and improve performance, particularly in streaming multimedia applications. Similarly, processor 303 sends the same data over the channels 314 and 315. Alternatively, subgraphs may be created based on sender-processors, or receiver-processors, for example a subgraph may be formed for all channels, irrespective of data, which emanate from a single sender-processor.

Figure 4A:
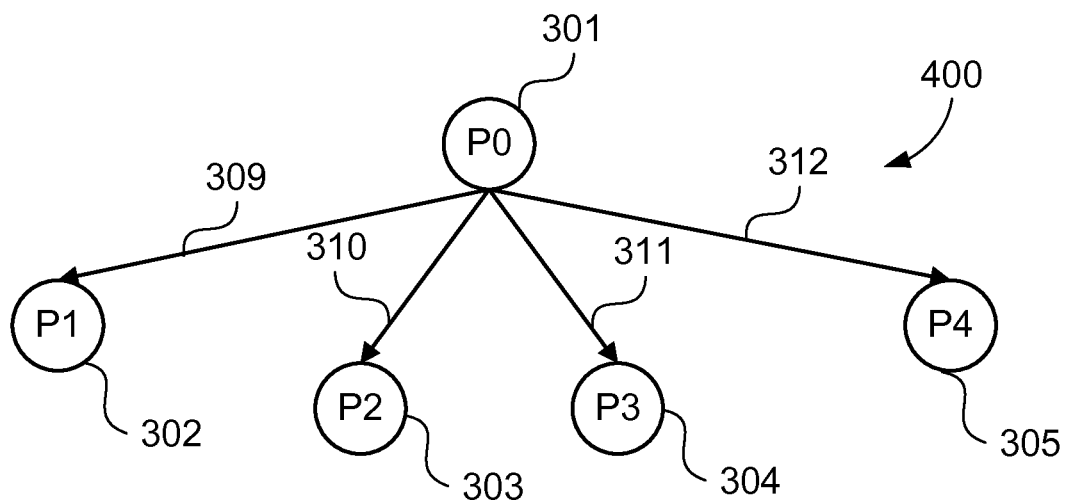
FIGS. 4A to 4C illustrate a subset of subgraphs for the graph shown in FIG. 3 developed according to the present disclosure.
Figure 4B:
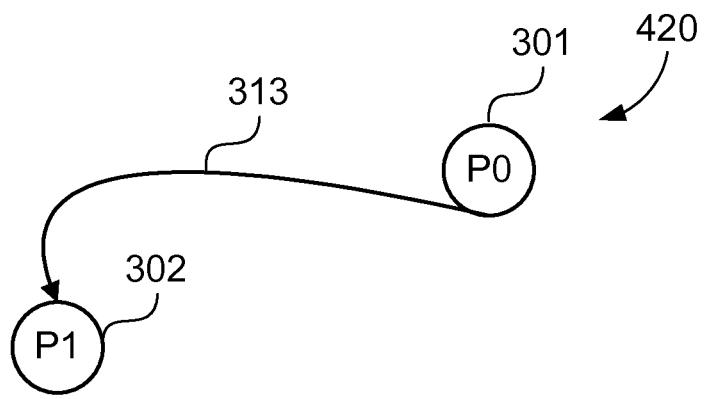
Figure 4C:
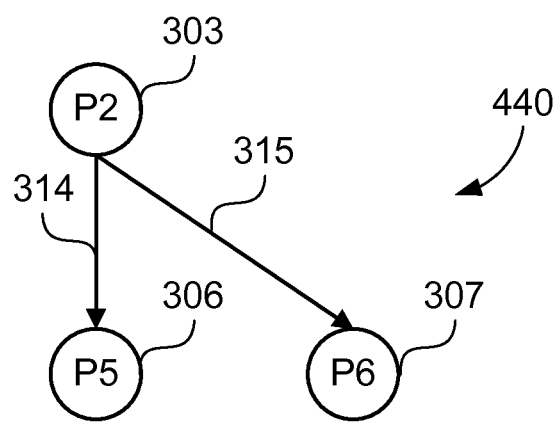

FIGS. 4A to 4C show a subset of the possible subgraphs of the graph 300 determined based on the common data transmitted between processors. Subgraph 400 of FIG. 4A consists of the communication channels 309-312, which carry the same data transmitted by processor 301 to each of the processors 302-305. Similarly, subgraph 440 of FIG. 4C consists of two communication channels carrying the same data. Subgraph 420 of FIG. 4B consists of only one communication channel 313 as the data transmitted over the channel is different to the data transferred over other channels, particularly channel 309, of the graph 300.

Figure 5:
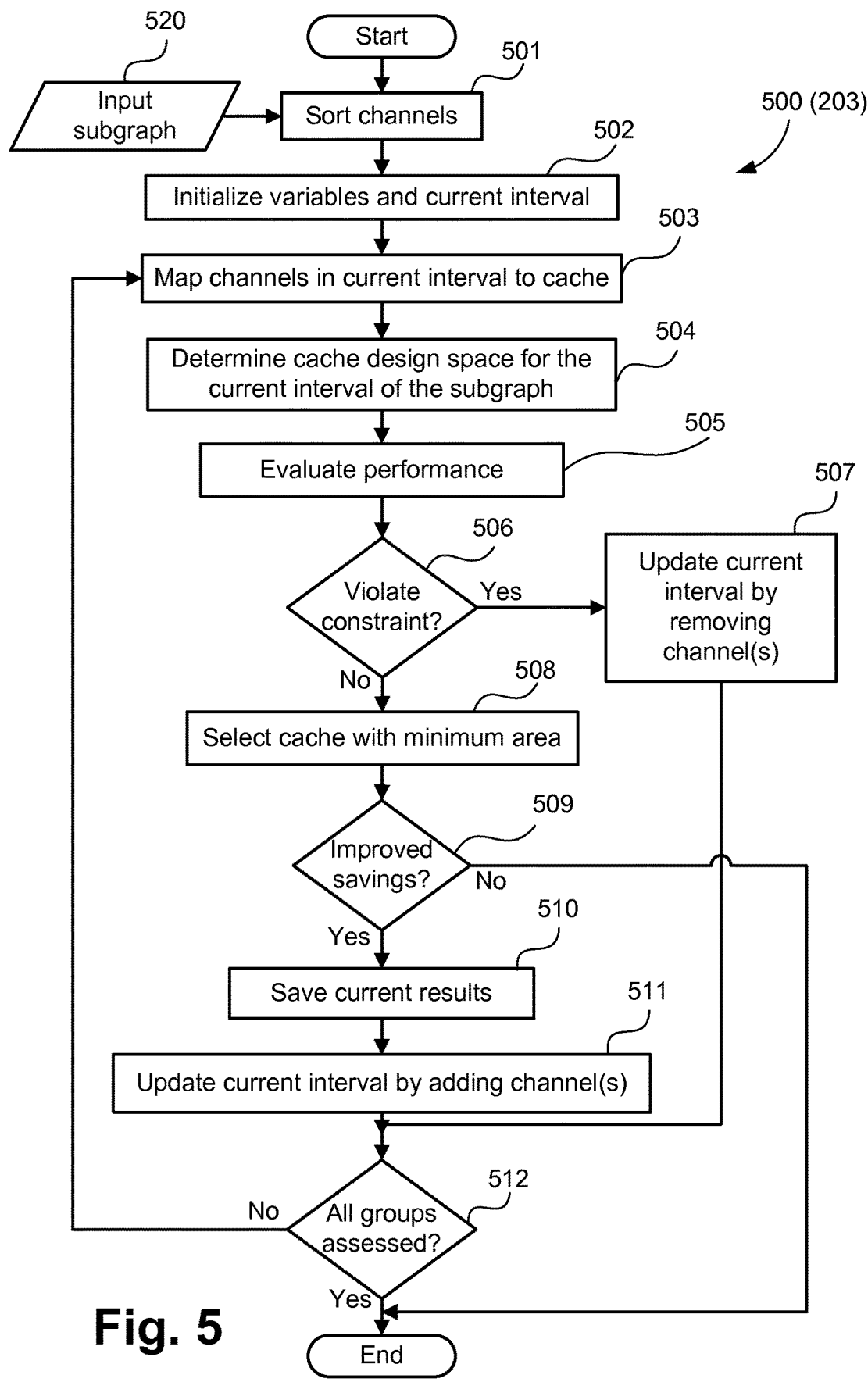
FIG. 5 is a data flow diagram illustrating a method to determine the memory solution for a subgraph.

Step 203 of the method 200 explores the design points in the subgraph design space to determine a memory solution for each of the subgraphs. FIG. 5 shows a method 500 to determine a memory solution for a subgraph. The method 500 is implemented as one of the application programs 1233 executed by the CPU 1205. The method 500 starts at a step 501, where the communication channels of an input subgraph 520 are sorted, for example into a list, based on the communication budget of the receiver-processors. For example, with the subgraph 400 of FIG. 4A, the four communication channels 309-312 each have a corresponding receiver-processor P1-P4, each of which, depending on the process performed, will have a different communication budget. A communication budget provides an estimate of the time any processor may spend for communication of data as a receiver-processor. The time generally depends on the application being performed, and user constraints, and can for example be of the order of milliseconds or nanoseconds. The communication budget is estimated based on a computation time of a processor and a performance constraint provided by the designer. Computation time and communication time are separate values, where computation time is only for processing, while communication is for data transfer. Performance constraint represents the throughput of the MPSoC. Computation time for a processor is the time which the processor spends solely for computation purposes, and can be estimated by performing an initial simulation of the MPSoC graph with all channels mapped to FIFOs.

FIG. 6 shows an example of an initial subgraph table 600 for the subgraph 400 of FIG. 4A with channels sorted based on the communication budget of the receiver-processors. Channels are sorted from the highest to the lowest value of communication budget and each channel is assigned an index value. For example, a row 601 corresponding to the communication channel 309 has the highest communication budget with an assigned index value of 0 and the row 604 corresponding to the communication channel 312 has the lowest communication budget with the highest index value.

The method 500 then proceeds to the step 502, where several variables are initialised by the CPU 1205. Variable CURR_SOL points to the current memory solution of the subgraph and is initialised to a default memory solution in which all the channels are mapped to FIFOs and all processors of the subgraph have associated LMs. For example, in the subgraph table 600 of FIG. 6, the variable CURR_SOL is initialised with the memory solution where all channels are mapped to FIFOs and receiver-processors have LM 606 associated to them. Initial sizes of the LMs are governed by the application and are provided as input to the method 500. The initial memory solution selected at the step 502 does not include shared cache. Variable START is initialised with the smallest channel index value in the list of sorted channels for the subgraph. Variable END is initialised with the maximum channel index value of the list of sorted channels for the subgraph. As an example, for the subgraph table 600, START=0; and END=3. These variables hold index values of the communication channels in the subgraph.

Also at step 502, further variables INIT_AREA, PREV_SAVINGS and CURR_SAVINGS are also initialised by the CPU 1205. INIT_AREA represents MPSoC area in which all the channels mapped to FIFOs. PREV_SAVINGS and CURR_SAVINGS are initialised to 0. CURR_SAVINGS and PREV_SAVINGS indicate the savings in the MPSoC area achieved by using the current memory solution and the previous memory solution of the subgraph in comparison to the INIT_AREA. Savings in the area is determined by subtracting the area of the MPSoC based on a subgraph memory solution from the area of the MPSoC with all channels mapped to FIFOs The method 500 uses a half-interval approach to evaluate the groups of channels. In the half-interval approach, a group of channels of a subgraph, representing a "current interval", is created by iteratively increasing or decreasing the value of the variable END. It is to be noted that the current interval includes channels with index values ranging from START to END. The initial current interval established at step 502 includes all the channels of the subgraph, where channels are sorted from the highest to the lowest value of communication budget. During the operation of the loop of steps 503-512 to be described, the value of END is iteratively increased or decreased by $(N/2^i)$, where 'N' is the total number of channels in the subgraph and 'i' is the iteration number of the loop. The iteration number, 'i', is initialised with the value of 1 and transition of the feedback loop from step 512 to step 503 increments the iteration number by one in the method 500. Channels indicated by a current interval are mapped to each of the caches for performance evaluation. The channels which are not part of the current interval are mapped to FIFOs. If the performance constraints are not satisfied then the value of END is decreased by $(N/2^i)$ to remove channels from the current interval. Otherwise, if the performance constraints are met, then the value of END is increased by $(N/2^i)$ to add channels to the current interval.

Figure 7:
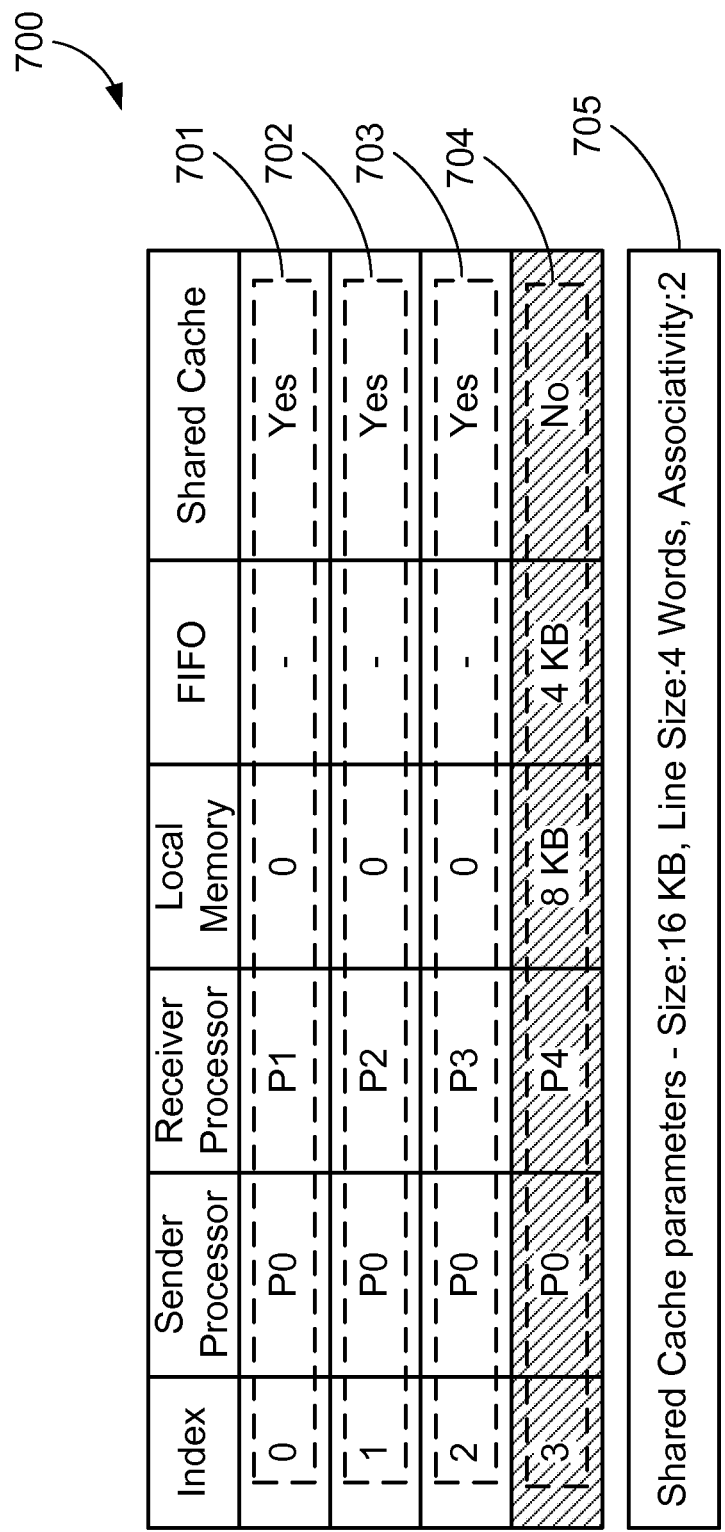
FIG. 7 is an example of a memory solution for the subgraph 400 shown in FIG. 4A.
Figure 8:
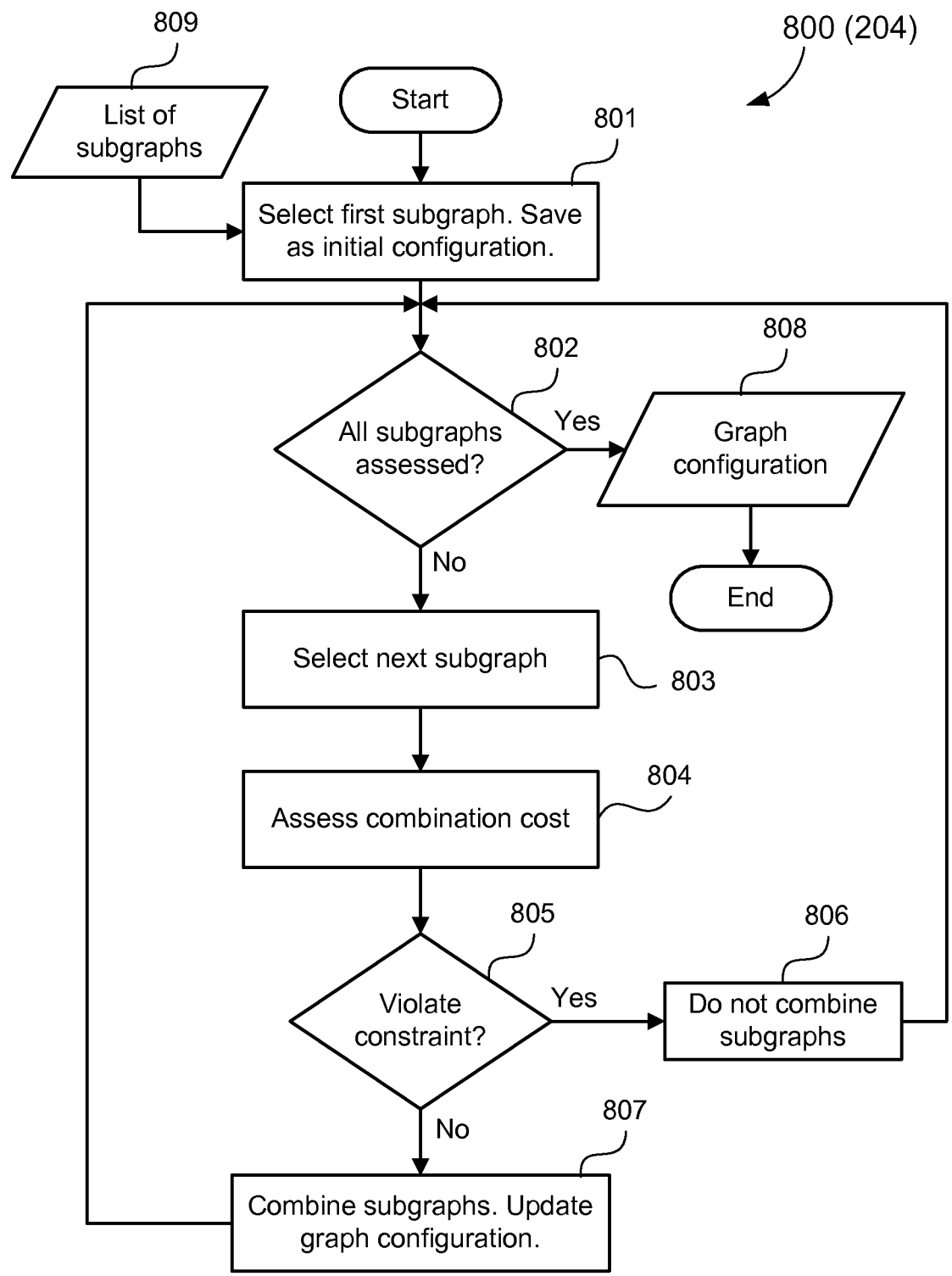
FIG. 8 is a data flow diagram illustrating a method to combine the memory solutions of the subgraphs.

The half-interval approach is further described using a memory solution 700 shown in FIG. 7 for the subgraph 400. The memory solution 700 indicates that channels 701-703 are mapped to shared cache and the corresponding receiver-processors have no associated LM. Memory solution 700 includes the cache parameters 705 determined for the subgraph 400. Channel 704 is mapped to a FIFO with its receiver-processor having a LM of size 8 KB. For this example, initially all channels 701-704 form the current interval, and the MPSoC performance is evaluated by mapping them to each of the shared caches in the subgraph design space. The channels not part of the current interval are mapped to FIFOs. If performance constraints are not satisfied, then the value of END is decreased by 2 (N=4, i=1) to update the current interval. The updated current interval then includes channels 701 and 702, and the MPSoC performance is evaluated by mapping channels to each of the shared caches. In this example, the current interval including the channels 701 and 702 meets the performance constraints, therefore, the value of END is increased by 1 (N=4, i=2) to update current interval. The updated current interval then includes channels 701-703 and the MPSoC performance is evaluated by mapping to each of the shared caches. This process is continued until either the area savings provided by a current interval stops improving or no more channels can be added to or removed from the current interval (i.e. $((N/2^i))<1$).

Figures 18A, 18B:
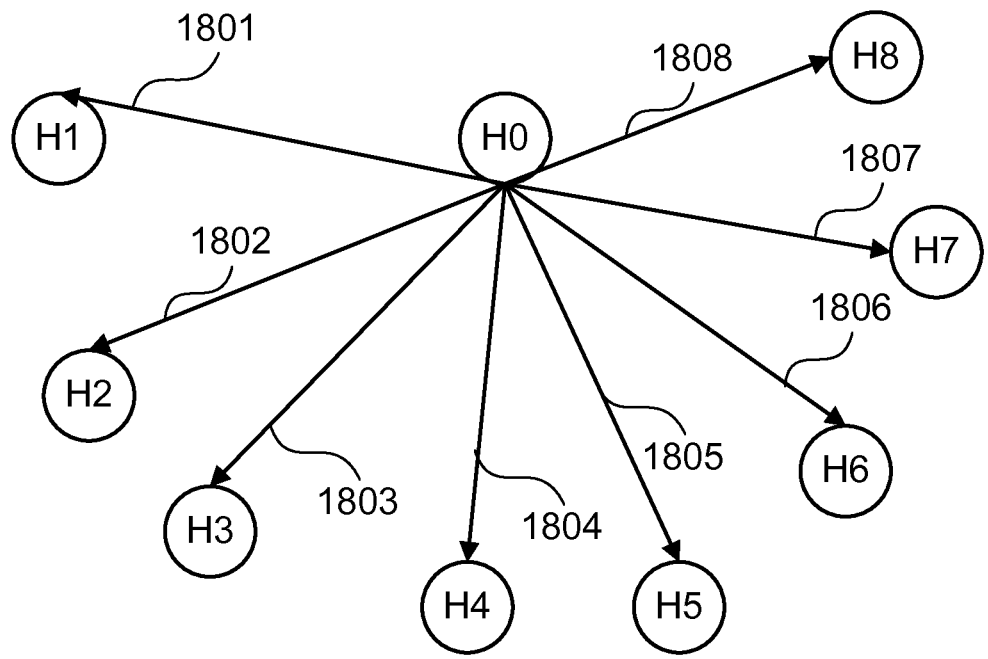
FIGS. 18A and 18B illustrate an example of a half-interval approach to evaluate the groups of channels.

The half interval approach is further explained using the FIG. 18A and FIG. 18B. FIG. 18A shows an example of a subgraph with nine processors H0-H8 and eight channels 1801-1808. FIG. 18B shows the index values and the channels sorted according to the communication budget. Initially, START and END are initialised by the index values of 0 and 7 respectively. If the performance constraints are not satisfied, then in iteration 1, channels are removed by decreasing the END to an index value of 3. If the performance constraints are satisfied for the current interval, then, in iteration 2, channels are added by increasing END to 5. In the next iteration END is reduced to 4 to remove one channel.

As noted above, the loop of steps 503-512 operates on a single group of channels forming the current interval. The initial current interval comprises all channels of the input subgraph 520. At step 503, the channels indicated by the current interval are each mapped to each of a number of possible solutions of shared cache for performance evaluation. Each possible solution may have only a single shared cache for the subgraph, with the size, values and parameters of the shared cache varying between the possible solutions. In one embodiment, a solution is for the entire graph to be implemented with a single shared cache. At step 504, a cache design space for the channels of the current interval of the subgraph is determined. In this implementation, the cache design space includes variations of cache memory size from half of the data size to the sum of data size and local memories in the current interval of the subgraph. As will be appreciated from the description of steps 507 and 511 where channels are removed from or added to the current interval, the cache memory size will correspondingly vary. Data size for a channel indicates the amount of data transferred in one iteration of a streaming application. For example, the streaming application can be a video processing application with a group of pixels (i.e. a subset of a single video frame) being processed by the MPSoC in each iteration. In the subgraph table 600, data size 605 indicates the amount of data transferred on each channel for each iteration. The cache design space also includes variations of associativity and the line size. As an example, for the subgraph table 600, data size 605 is 4 KB. Cache design space includes variations of cache memory size, for example from 2 KB (half the data size) to 28 KB (the sum discussed above), where cache memory size may be divided in multiple sets governed by the cache associativity. Cache size is incremented based on a predetermined value, for example, 4 KB. An upper limit of the cache associativity and line size variations is provided as input to the method 500 by the designer. In this example, cache associativity variations include 1, 2 and 4 ways. Line size variations include 1 word, 2 words, 4 words and 8 words, where 1 word is 32 bits. For each of the cache size determined, there can be line size and associativity variations. These are very standard terms in relation to caches. Cache size is rounded to the nearest upper power of two in each of the variations in the caches in the design space of a subgraph, since memory blocks on-chip are configured in such size steps. In this implementation, for all the channels which are mapped to a shared cache, LM associated with the corresponding receiver-processor is removed. In another implementation, for all the channels which are mapped to a shared cache, LM associated with the corresponding receiver-processor is reduced to a size specified by the designer. The size of the LM specified by the designer is governed by the input application.

At step 505, performance of the MPSoC is evaluated using simulations. MPSoC performance is evaluated for all the variations of the cache design space at this step. It should be noted that performance evaluation can be done using any of a number of known simulation methods including, but not limited to, RTL simulation, instruction set simulation or simulation using SystemC based models. In addition to simulation methods, cache estimation models can be used to provide an estimate of the performance. Various simulation and estimation models differ in the level of accuracy and associated runtimes.

At step 506, it is ascertained whether any of the design points in the subgraph design space meet the performance constraint. If no design point of the subgraph design space satisfies the performance constraint, then the method 500 proceeds to step 507 where the current interval is updated to reduce the number of channels under consideration by decreasing the value of END. In one embodiment, value of the variable END is decreased by $(N/2^i)$, where 'N' is the total number of channels in the subgraph and 'i' is the iteration number of the method 500. In this fashion, at least one communication channel is removed from the current interval, being that channel whose index is END or adjacent to END, being that or those with the lowest communication budget. Channels with lowest communication budget are removed. This is due to the fact that such will be harder to implement using shared cache.

If the performance constraint is determined in step 506 to be met by at least one cache variation of the subgraph design space for the current interval, the method 500 proceeds to step 508 instead of step 507.

At step 508, the design point of the subgraph design space with the minimum area is selected as the current memory solution of the subgraph. The area for a memory solution is the sum of the shared cache area, FIFO area and LM area. CURR_SAVINGS is determined by subtracting the area of the MPSoC based on a selected memory solution from the INIT_AREA. At step 509, the CPU 1205 evaluates whether CURR_SAVINGS is greater than PREV_SAVINGS or not. If the CURR_SAVINGS is less than the PREV_SAVINGS, then the method 500 is terminated, and the CURR_SOL provides the memory solution for the subgraph. This is because the list of channels from the input subgraphs are ordered and the subgraphs are based upon common data whereupon, under these conditions, savings will only reduce and thus further iterations are counterproductive.

If the CURR_SAVINGS is determined at step 509 to be more than PREV_SAVINGS, then CURR_SOL and PREV_SAVINGS are updated at step 510. PREV_SAVINGS is updated with the value of CURR_SAVINGS and CURR_SOL is updated to indicate the current memory solution of the subgraph.

At step 511 of the method 500, channels are added to the current interval by updating the value of the variable END. The value of the variable END is increased by $(N/2^i)$, where 'N' is the total number of channels in the subgraph and 'i' is the iteration number of the method 500. As a consequence of this update, channels of the input subgraph 520 with higher indices than those just processed are added to group forming the current interval.

Step 512 assesses whether all possible groups of channels have been assessed based on the half-interval approach discussed previously. At step 512, the method is terminated if the value of '$N/2^i$' is less than 1, otherwise, the method 500 returns to step 503 and the value of the iteration number is incremented by 1.

As an example, assuming a subgraph has 4 channels and a first iteration of the method 500 violates the constraints at step 506, then 2 channels are removed at step 507. The second iteration, based on 2 channels in the current interval, then satisfies the constraints, and then adds back at step 511 into the current interval the next highest index channel previously removed. The third iteration assesses the 3 channels of the current interval and two alternatives may occur. In the first alternative, the 3 channels may satisfy the constraint and step 512 terminates resulting in one memory solution with 3 lowest index channels mapped to shared cache and remaining channels mapped to FIFOs. That subgraph memory solution is for a single shared cache representing the 3 lowest index channels. The remaining channel of the subgraph, but not in the current interval, is then implemented by a FIFO. In the second alternative, the third iteration may violate the constraints and removes from the current interval, at step 507, the channel just added. The loop is processed again and the 2 channels of the current interval again satisfy the constraint at step 506, and step 511 does not add any channel due to update criteria not being satisfied. The 2 channels of the current interval mapped to shared cache form part of a memory solution for the input subgraph 520. The remaining 2 channels are implemented using respective FIFOs. As such, with the conclusion for step 512, when satisfied all channels in the current interval are implemented using a shared cache, and any remaining channels are each implemented using a corresponding FIFO.

Figure 10:
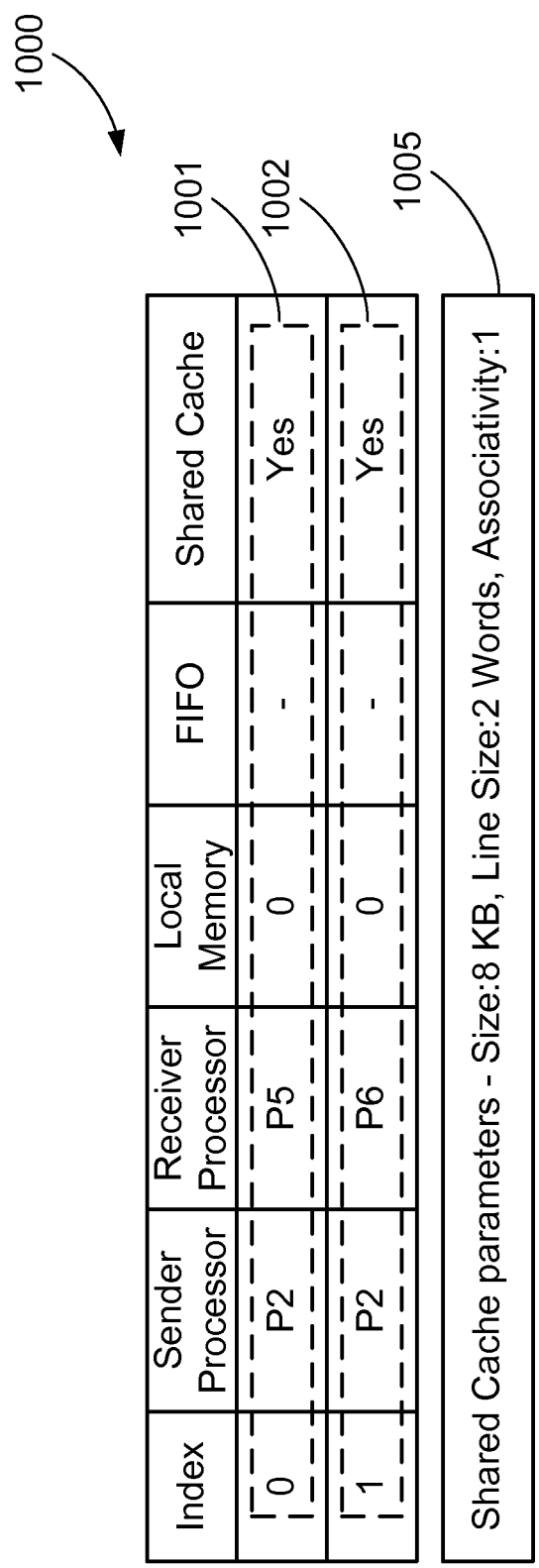
FIG. 10 is an example of a memory solution for the subgraph 440 shown in FIG. 4C.

The method 500 selects one memory solution for the subgraph. Memory solution 700, described earlier, is an example of the outcome of the method 500. Similarly, memory solutions for other subgraphs are determined using the method 500. FIG. 10 shows an example of a memory solution 1000 for the subgraph 440 of FIG. 4C.

After the memory solutions for the subgraphs are determined, the MC-IPrC for the graph representing MPSoC can be determined according to the step 204 of the method 200. Method 800 describes the step 204 in detail. According to the method 800, the memory solution of a subgraph providing maximum area savings is recursively combined with the memory solutions of other subgraphs to determine a MC-IPrC for the graph representing the MPSoC. The method 800 takes a list of subgraphs 809 and their corresponding memory solutions as input. The method 800 starts at step 801 by selecting a first subgraph which provides the maximum area savings from a list of subgraphs 809. The memory configuration for the graph is initialised with the memory solution for the selected subgraph. The memory configuration initialised at the step 801 has channels, which are not part of the selected subgraph, mapped to FIFOs. At step 802, a check is performed to determine if there are any more subgraphs to be assessed. If there are more subgraphs to assess, the method 800 proceeds to step 803 where a second subgraph is selected, based on area savings, from the remaining subgraphs of the list 809. Step 804 assesses a combination cost of the first and second subgraphs. The combination cost measures the impact for the area savings of on-chip memory when combining two memory solutions under a performance constraint. The two memory solutions may be combined to create a new memory solution if the combined memory solution provides greater area savings in comparison to the area savings provided by the memory solution of the first subgraph. For example, a 1st subgraph provides savings considering that $1^{st}$ subgraph in isolation. A $2^{nd}$ subgraph provides savings considering the $2^{nd}$ subgraph in isolation. The solutions of those 2 subgraphs can be combined, according to FIG. 9. A new memory solution is determined, which can provide more area savings than 1st subgraph.

In addition to the area savings, memory solutions of the two subgraphs can only be combined if the MPSoC based on the combined memory solution meets the performance constraint. The result of the assessment of the combination cost is checked at the step 805 to see if the combination meets the performance constraint. It should be noted that the channels which are not part of the two subgraphs under consideration are mapped to FIFOs for performance evaluation of the MPSoC. If the performance constraint is not met, then the second subgraph is discarded for further assessment at step 806 and the method returns to the step 802 to assess any remaining subgraphs. Any subgraphs, whose memory solutions cannot be combined with other memory solutions, have all their channels mapped to FIFOs. The combination of subgraphs to determine combined memory solution is repeated until all the subgraphs have been assessed. If the combination of the memory solutions of two subgraphs meets the performance constraint, then a new memory solution is created and a new set of subgraphs is created which includes first and second subgraph at step 807. This new set of subgraphs is treated as the first subgraph at step 802 in the next iteration. The memory configuration for the graph is updated to include the combined memory solution. Once all of the subgraphs have been assessed, step 808 provides the memory configuration for inter-processor communication for the graph representing heterogeneous MPSoC.

Figure 9:
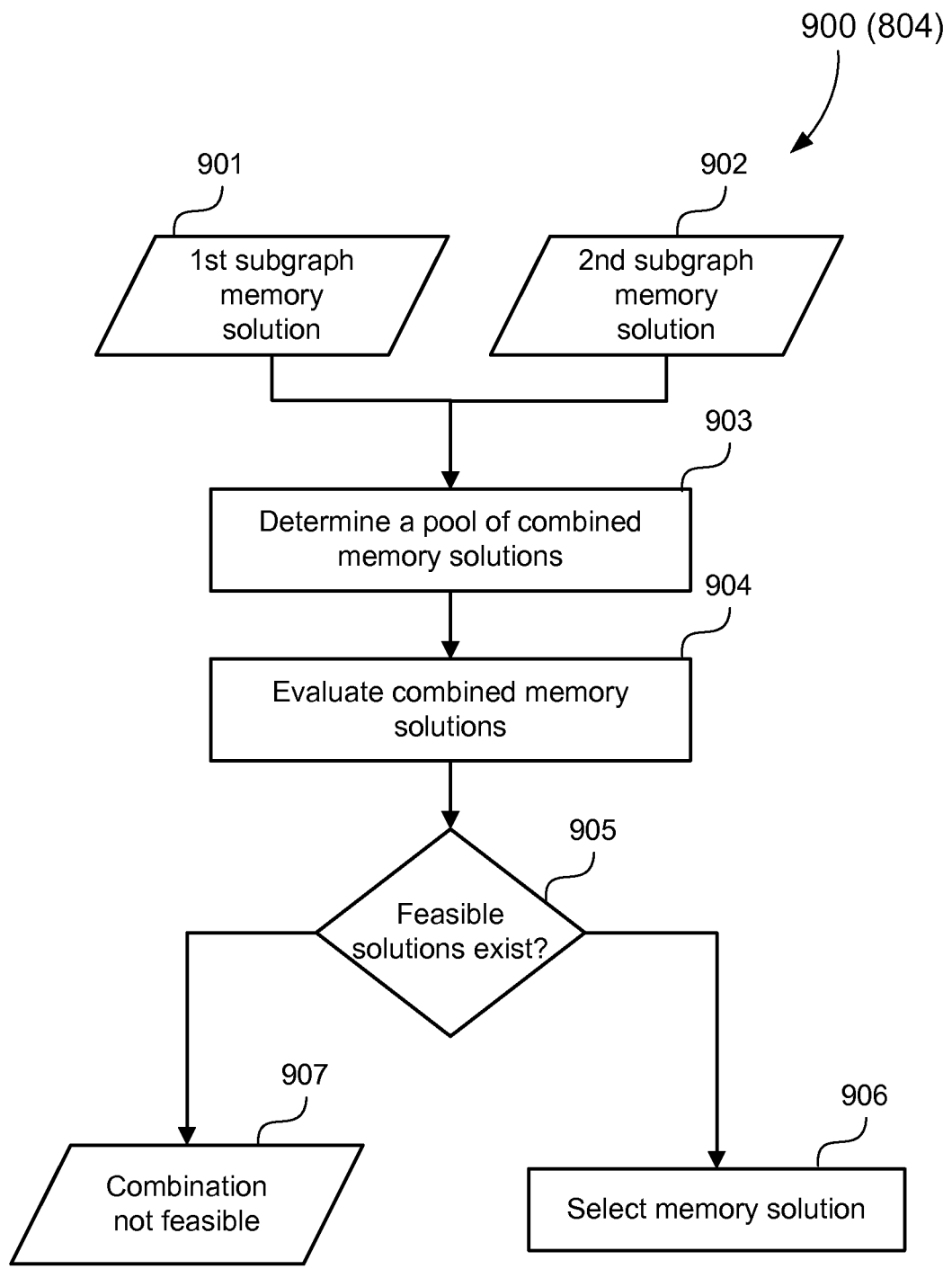
FIG. 9 is a data flow diagram illustrating a method to assess the combination cost of combining the memory solutions of two subgraphs.

FIG. 9 describes a method 900 for the step 804 in further detail. The method 900 starts at step 903 where a memory solution of a first subgraph 901 and a second subgraph 902 are received as input. The memory solution of a first subgraph 901 can be a combination of a plurality of subgraph memory solutions. At the step 903, the memory solutions of the two subgraphs are analysed and a pool of possible combined memory solutions is created for the two subgraphs. The pool of memory solutions vary only in their cache configuration and other aspects of the memory solutions are the same. The channels of the two subgraphs under consideration are mapped to either FIFOs or shared cache according to their corresponding memory solutions. The channels not part of these two subgraphs are mapped to FIFOs. Using the cache configurations of the two memory solutions, a cache design space for combined memory solutions is determined. This is further described using the memory solutions 700, 1000 and a combined memory solution 1100. As an example, memory solution 700 is for the first subgraph 400 and memory solution 1000 is for the second subgraph 440, which are under consideration for combination. The channels 701-703 of the memory solution 700 are mapped to shared cache and the channel 704 is mapped to a FIFO. The memory solution 1000 has two channels 1001 and 1002 mapped to a shared cache with parameters 1005. Each of the cache parameters, such as size, line size and associativity, is varied ranging from the minimum values of either of the two memory solutions to a sum of the values of the two memory solutions. The sum is rounded off to the nearest upper power of two. For example, cache size of first memory solution 700 is 16 KB and of the second memory solution 1000 is 8 KB. So the cache size can be varied from 8 KB to 32 KB, where 32 KB is 8+16 rounded up to 32. Similarly, for this example, line size can be varied from 2 words to 8 words. Associativity can be varied from 1 way to 4 ways. At step 904, each of the memory solutions in the pool is evaluated in terms of area savings and performance requirement. A combined memory solution has to provide higher area savings, in comparison to the first memory solution, and also satisfy the performance requirement. Area savings for any combined memory solution is calculated by subtracting a gate count of the MPSoC based on a combined memory solution from the gate count of an MPSoC with all channels mapped to FIFOs. For example, the combined memory solution 1100 has channels 1101-1103 and 1105-1106 mapped to shared cache, while channel 1104 is mapped to FIFO in order to satisfy performance constraint. Performance requirements are assessed by simulating the variations of MPSoC based on the combined memory solutions in the pool of solutions. It should be noted that different types of simulations can be used including RTL simulation, instruction set simulation or simulation using SystemC based models. In addition to the simulation methods, estimation models can be used to provide an estimate of the performance. At step 905, it is assessed whether there are any combined memory solution which provides more area savings as compared to first memory solution, along with satisfying performance constraint. If there are multiple memory solutions which satisfy both the constraints, then the memory solution which provides maximum area savings is selected. Step 906 provides the selected combined memory solution while 907 indicates that no solution exists which meets the constraints.

Figure 3:
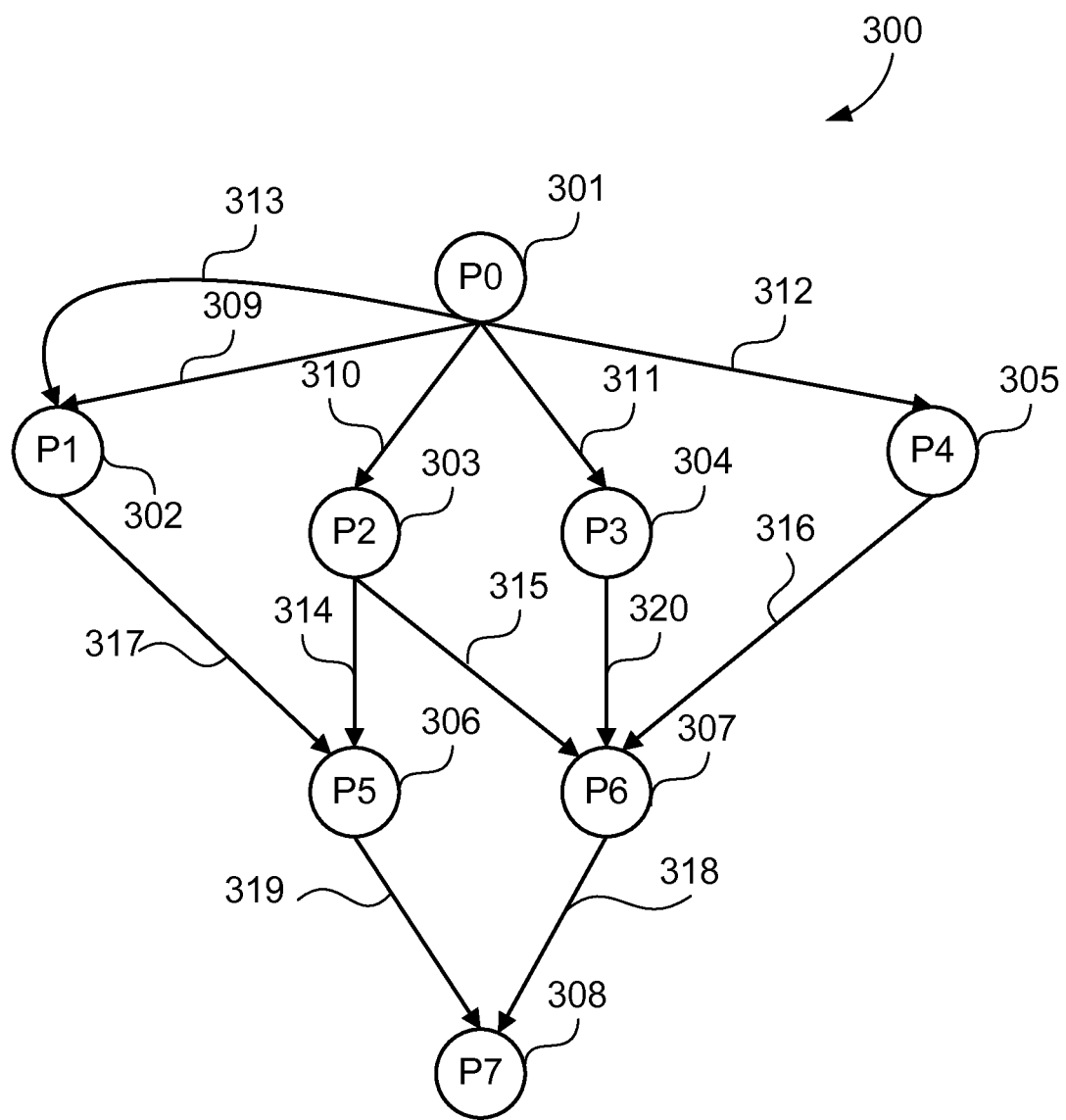
FIG. 3 is an example of a graph representing heterogeneous MPSoC.
Figure 15:
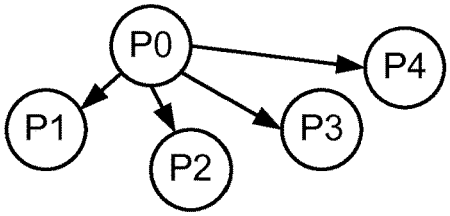
FIG. 15 is a table of possible memory solutions of the sub-graphs of the graph representing MPSoC of FIG. 3.
Figure 15:
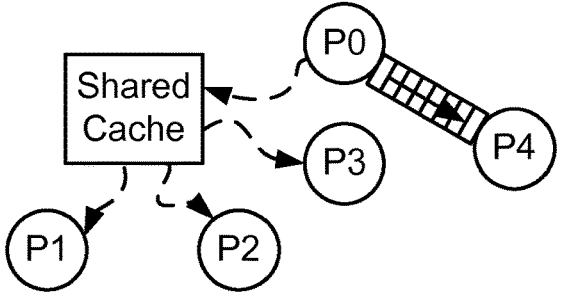
Figure 15:
Figure 15:
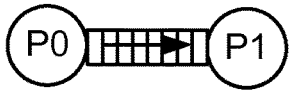
Figure 15:
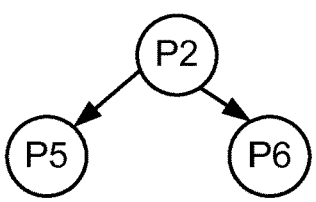
Figure 15:
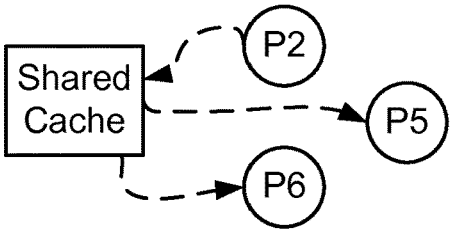
Figure 15:
Figure 15:
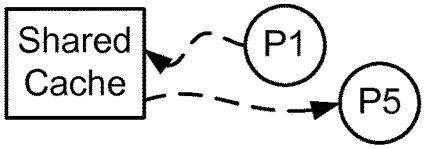
Figure 15:
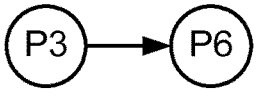
Figure 15:
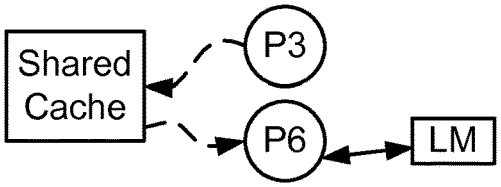
Figure 15:
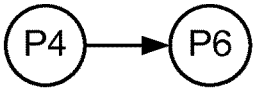
Figure 15:
Figure 15:
Figure 15:
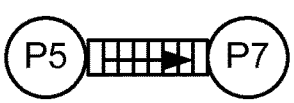
Figure 15:
Figure 15:

FIG. 15 shows a table representative of a list of sub-graphs in the left column, being each of the sub-graphs identified from the example of FIG. 3. Each sub-graph has a possible memory solution in the right column. For the first three sub-graphs, corresponding to FIGS. 4A, 4B and 4C, the memory solutions correspond to that of FIG. 7, a simple FIFO, and that of FIG. 10. For the sub-graph of FIG. 4B, such may be implemented as either a FIFO or a shared cache since the shared cache did not satisfy performance requirement or did not provide any area savings.

For the remaining rows in FIG. 15, an exemplary possible memory solution has been illustrated notwithstanding a specific worked solution is not offered, but may be developed similarly to that of FIGS. 7 and 10. Notably, those each of the FIFOs has a corresponding direction, and connections to shared cache are also unidirectional, replicating that of the sub-graph.

Figure 17:
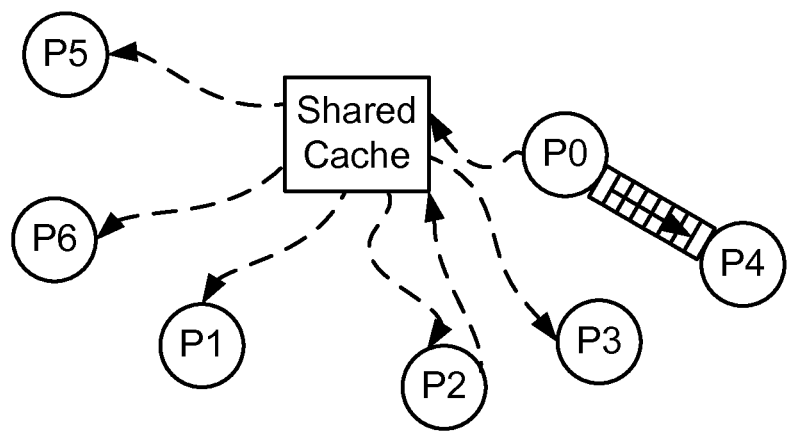
FIG. 17 is an example of a possible memory solution as a result of the combination of two subgraphs corresponding to FIG. 4A and FIG. 4C.

FIG. 17 shows an example of a possible memory solution as a result of combining subgraphs 400 and 440 according to the method 900. The individual memory solutions of the subgraphs 400 and 440 are depicted in the right column of the first and third row of FIG. 15.

Figure 16:
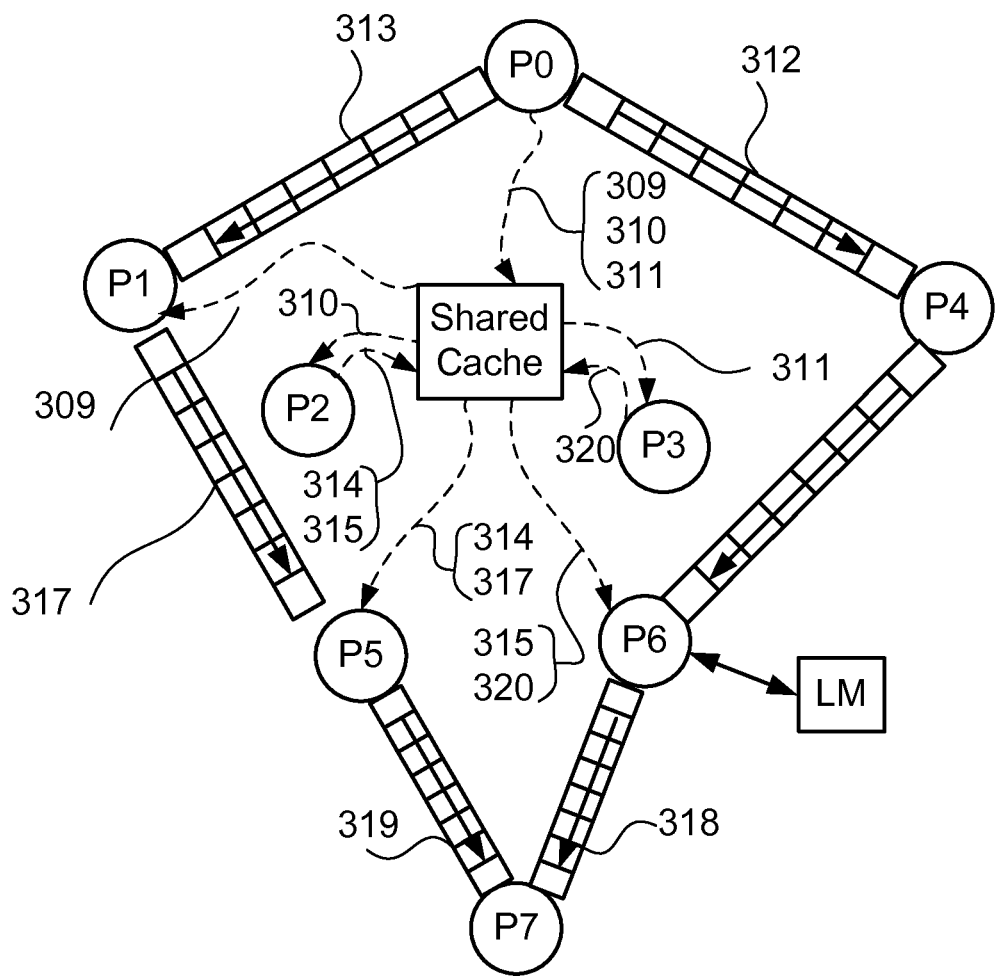
FIG. 16 is an example of a possible MC-IPrC for the graph of FIG. 3 from the table of FIG. 15.

FIG. 16 shows an example of a possible MC-IPrC based on the subgraphs in FIG. 15 for an MPSoC represented by the graph in FIG. 3. Notably, the individual shared cache of the memory solutions of FIG. 15 are merged into a single shared cache having a capacity determined to accommodate the required communications between the respective processors. In FIG. 16, the various channels of the graph of FIG. 3 are enumerated against the corresponding implemented channel, noting that for the shared cache, some connections replicate multiple channels. For FIG. 16, it may be that the solutions of all the subgraphs will be successfully combined. However, any 2 subgraphs may or may not be able to be combined. If they are not combined together, then the channels of one subgraph (being that providing less savings) will be implemented by FIFOs. Refer combination flowchart. In FIG. 16, the link of P1 to P5 is by FIFO indicating that this subgraph could not be combined, and the channel ended up as being implemented as a FIFO.

Second Implementation

In an alternative implementation, a MC-IPrC is determined to reduce communication energy of the heterogeneous MPSoC while satisfying performance constraints provided by the designer. Communication energy, typically measured in Watts, includes energy consumed by the processors in relation to the data communication and the energy consumed by the on-chip memories part of the memory configuration for inter-processor communication. In this implementation, step 505 of the method 500 is replaced with a step which gathers performance as well as energy consumption values from simulations. It should be noted that a variety of simulations can be used including RTL simulations, instruction set simulation or simulation using SystemC based models. Industry standard tools can be used to extract the energy consumption values of the processors and the memory solutions of the subgraphs. Further, step 508 is replaced with a step to select the memory solution with a minimum communication energy, and step 804 of the method 800 assesses combination cost. In this implementation, combination cost includes the savings in the communication energy provided by a combined memory solution of the subgraphs. The combined memory solution is feasible if it provides more communication energy savings when compared to the memory solution of the first subgraph. In addition to that the combined memory solution should also satisfy the performance constraint.

Figure 13:
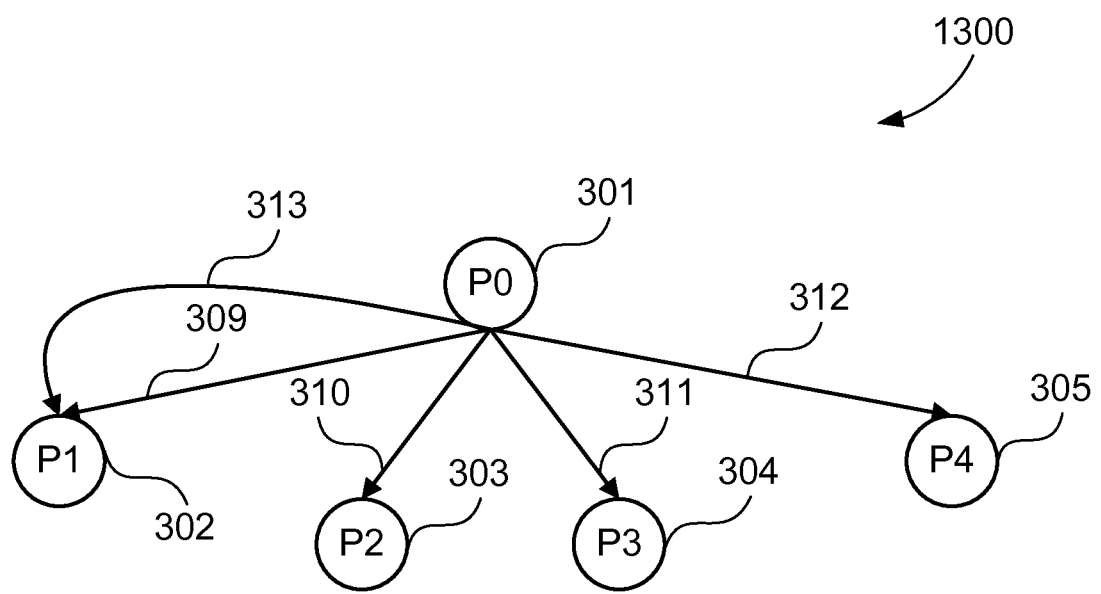
FIG. 13 is an example of a subgraph determined according to an alternative approach.

In another implementation, at step 202, subgraphs are determined based on the direct connections between a sender-processor and one or more receiver-processors. Two processors are considered to have a direct connection if any communication channel connects the two processors. For example, FIG. 13 shows one of the subgraph 1300 determined from the graph 300 based on this rule. The subgraph 1300 consists of channels 309-313 as each channel connects the processor 301 to one of the receiving processors 302-305.

Figure 14:
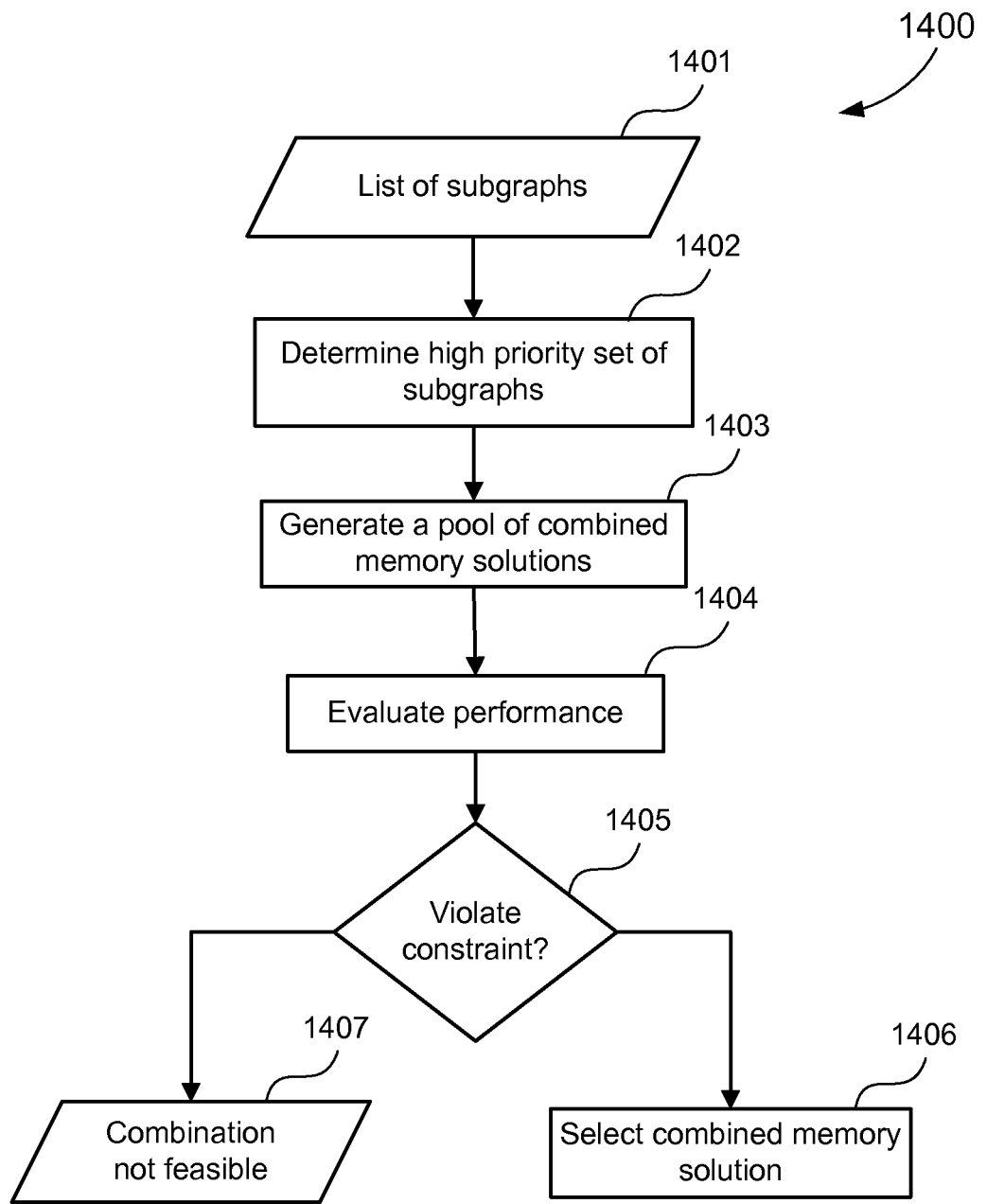
FIG. 14 is a data flow diagram illustrating a method to combine memory solutions according to the alternative approach.

In another implementation, a list of subgraphs is determined from the graph representing MPSoC. A high priority set of subgraphs is determined from the list of the subgraphs based on the savings provided by their memory solutions. The high priority set of subgraphs is determined such that it includes only those subgraphs whose memory solution provides more savings than predetermined threshold savings, which are provided as input by a user. For example, threshold savings can be specified as 0, which implies that all subgraphs whose memory solutions provide positive savings are included in the high priority set of subgraphs. FIG. 14 illustrates a method 1400 which begins at a step 1402. At the step 1402, a high priority set of subgraphs is determined from an input list of subgraphs 1401. At step 1403, a pool of combined memory solutions is generated. The pool of combined memory solutions consists of solutions which are generated by collectively assessing the complete set of high priority subgraphs, for example according to the method 500. It should be noted that the high priority set can include more than two subgraphs, which are assessed together to generate any combined memory solution part of the pool of solutions. The performance of each of the memory solution available in the pool is evaluated at step 1404 using simulations or estimation based methodology. At step 1405, results of the performance evaluation are assessed for feasibility and a combined memory solution providing maximum savings is selected at the step 1406. Step 1407 indicates that combination is not feasible if no feasible solutions are found at the step 1405. The combined memory solution for the high priority set of subgraphs along with the individual memory solutions for subgraphs not part of the high priority set, form a MC-IPrC for a graph representing heterogeneous MPSoC.

INDUSTRIAL APPLICABILITY

The arrangements described are applicable to the computer and data processing industries and particularly for the assisted automated design of MPSoC devices. Particularly the arrangements disclosed provided for design and development of heterogeneous multi-processor systems having an inter-processor communication configurations tailored to the specific application of the designer and generally optimised for performance with the available chip space.

The foregoing describes only some embodiments of the present invention, and modifications and/or changes can be made thereto without departing from the scope and spirit of the invention, the embodiments being illustrative and not restrictive.

We claim:

1. A method of determining a configuration for inter-processor communication for a heterogeneous multi-processor system, the method comprising:

determining subgraphs of a graph representing communication between processors of the heterogeneous multi-processor system, the subgraphs being determined by grouping communication channels carrying same data, the communication channels being sorted based on an estimate of time a processor may spend for communication of data as a receiver processor;

determining a memory solution for each of the subgraphs by exploring a design space of the subgraphs in isolation, the design space being variations of first-in-first-outs (FIFOs) and shared caches;

wherein the determining of the memory solution for each of the subgraphs comprises:

determining a plurality of subgraph design points for said subgraph, each of the subgraph design points having a variation of channel mapping between any two of the processors in the subgraph by selecting from the design space and a local memory associated with at least one of the processors according to the channel mapping; and selecting a memory solution for said subgraph, from the plurality of determined subgraph design points, based on a cost associated with the selected memory solution; and determining a configuration for the graph of the heterogeneous multi-processor system, based on the selected memory solutions, to determine the memory configuration for inter-processor communication for the heterogeneous multi-processor system.

2. The method according to claim 1, wherein the determining of the configuration for the graph comprises combining recursively combining subgraphs subject to a combination cost.

3. The method according to claim 1, wherein the determining the configuration of the graph comprises combining the memory solutions for each of the subgraphs in a pool in a single step.

4. The method according to claim 1, wherein the subgraphs are created based on common data transferred between processors.

5. The method according to claim 1, wherein the subgraphs are created based on the communication channels associated with one of a sender-processor or a receiver-processor.

6. The method according to claim 1, wherein the cost associated with the selected memory solution comprises a combination cost associated with the area of on-chip memory consumed for a combination of particular subgraphs.

7. The method according to claim 6 wherein the combination cost is associated with an area saving for on-chip memory associated with a performance constraint.

8. The method according to claim 1, wherein the cost associated with the selected memory solution is associated with energy savings under a performance constraint.

9. The method according to claim 1, wherein each of the subgraph design points has a variation of at least one of FIFO memory between any two of the processors of the subgraph, cache shared between any at least two of the processors of the subgraph, and local memory associated with any one of the processors of the subgraph.

10. A non-transitory computer readable storage medium having a program recorded thereon, the program being executable by a processor to determine a configuration for inter-processor communication for a heterogeneous multi-processor system, the program comprising:

code for determining at least one subgraph of a graph representing communication between processors of the heterogeneous multi-processor system, the subgraph being determined by grouping communication channels carrying same data, the communication channels being sorted based on an estimate of time a processor may spend for communication of data as a receiver processors;

code for determining a memory solution for each of the subgraphs by exploring a design space of the subgraphs in isolation, the design space being variations of first-in-first (FIFOs) and shared caches, wherein the code for determining the memory solution for each of the subgraphs comprises:

code for determining a plurality of subgraph design points for said subgraph, each of the subgraph design points having a variation of channel mapping between any two of the processors in the subgraph by selecting from the design space and a local memory associated with at least one of the processors according to the channel mapping; and code for selecting the memory solution for said subgraph, from the plurality of determined subgraph design points, based on a cost associated with the selected memory solution; and code for determining a configuration for the graph of the heterogeneous multi-processor system, based on the selected memory solutions, to determine the configuration for inter-processor communication for the heterogeneous multi-processor system.

11. The non-transitory computer readable storage medium according to claim 10, wherein the determining of the configuration for the graph comprises combining recursively combining subgraphs subject to a combination cost.

12. The non-transitory computer readable storage medium according to claim 10, wherein the determining the configuration for the graph comprises combining the memory solutions for each of the subgraphs in a pool in a single step.

13. The non-transitory computer readable storage medium according to claim 10, wherein the subgraphs are created based on common data transferred between processors.

14. The non-transitory computer readable storage medium according to claim 10, wherein the subgraphs are created based on the communication channels associated with one of a sender-processor or a receiver-processor.

15. The non-transitory computer readable storage medium according to claim 10, wherein the cost associated with the selected memory solution comprises a combination cost associated with the area of on-chip memory consumed for a combination of particular subgraphs.

16. The non-transitory computer readable storage medium according to claim 15 wherein the combination cost is associated with an area saving for on-chip memory associated with a performance constraint.

17. The non-transitory computer readable storage medium according to claim 10, wherein the cost associated with the selected memory solution is associated with energy savings under a performance constraint.

18. A heterogeneous multi-processor system having an inter-processor communication memory storing a computer-executable program of instructions for causing system to perform:
 determining at least one subgraph of a graph representing communication between processors of the heterogeneous multi-processor system, the subgraph being determined by grouping communication channels carrying same data, the communication channels being sorted based on an estimate of time a processor may spend for communication of data as a receiver processors;
 determining a memory solution for each of the subgraphs by exploring a design space of the subgraphs in isolation, the design space being variations of first-in-first-outs (FIFOs) and shared caches;
 wherein the determining of the memory solution for each of the subgraphs comprises:
  determining a plurality of subgraph design points for said subgraph, each of the subgraph design points having a variation of channel mapping between any two of the processors in the subgraph by selecting from the design space and a local memory associated with at least one of the processors according to the channel mapping; and
  selecting the memory solution for said subgraph, from the plurality of determined subgraph design points, based on a cost associated with the selected memory solution; and
 determining a configuration for the graph of the heterogeneous multi-processor system, based on the selected memory solutions, to determine the memory configuration for inter-processor communication for the heterogeneous multi-processor system.

19. The heterogeneous multi-processor system according to claim 18, wherein the subgraphs are created based on the communication channels associated with one of a sender-processor or a receiver-processor.

20. A computer system having at least a processor, a non-transitory memory storing a program recorded on the memory, the program being executable by the processor to determine a memory configuration for inter-processor communication for a heterogeneous multi-processor system for causing the computer system to perform a method comprising:
 determining subgraphs of a graph representing communication between processors of the heterogeneous multi-processor system, the subgraph being determined by grouping communication channels carrying same data, the communication channels being sorted based on an estimate of time a processor may spend for communication of data as a receiver processor;
 determining a memory solution for each of the subgroups by exploring a design space of the subgraphs in isolation, the design space being variations of first-in-first-outs (FIFOs) and shared caches;
 wherein the determining of the memory solution for each of the subgroups comprises:
  determining a plurality of subgraph design points for said subgraph, each of the subgraph design points having a variation of channel mapping between any two of the processors in the subgroup by selecting from the design space and a local memory associated with at least one of the processors according to the channel mapping; and
  selecting the memory solution for said subgraph, from the plurality of determined subgraph design points, based on a cost associated with the selected memory solution; and
 determining a configuration for the graph of the heterogeneous multi-processor system, based on the selected memory solutions, to determine the memory configuration for inter-processor communication for the heterogeneous multi-processor system.

* * * * *